US011735391B2

(12) United States Patent
Gerhold et al.

(10) Patent No.: US 11,735,391 B2
(45) Date of Patent: Aug. 22, 2023

(54) CHARGED-PARTICLE SOURCE

(71) Applicant: IMS Nanofabrication GmbH, Brunn am Gebirge (AT)

(72) Inventors: Stefan Gerhold, Vienna (AT); Werner Rupp, Straning (AT); Mattia Capriotti, Vienna (AT); Christoph Spengler, Vienna (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 0 days.

(21) Appl. No.: 17/234,320

(22) Filed: Apr. 19, 2021

(65) Prior Publication Data
US 2021/0335573 A1 Oct. 28, 2021

(30) Foreign Application Priority Data

Apr. 24, 2020 (EP) .................................... 20171308

(51) Int. Cl.
*H01J 37/063* (2006.01)
*H01J 37/04* (2006.01)
*H01J 37/147* (2006.01)

(52) U.S. Cl.
CPC ............ *H01J 37/063* (2013.01); *H01J 37/04* (2013.01); *H01J 37/1471* (2013.01); *H01J 2237/0213* (2013.01); *H01J 2237/06375* (2013.01)

(58) Field of Classification Search
CPC .......... H01J 37/063; H01J 37/10; H01J 37/12; H01J 37/147; H01J 37/1471; H01J 37/1478; H01J 37/16
See application file for complete search history.

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
DE 19634304 A1 2/1998
(Continued)

OTHER PUBLICATIONS

Munro, "Finite difference programs for computing tolerances for electrostatic Tenses", Journal of Vacuum Science & Technology B, Jun. 4, 1988, vol. 6, pp. 941-948, doi: 10.1116/1.584329.
(Continued)

*Primary Examiner* — Eliza W Osenbaugh-Stewart
(74) *Attorney, Agent, or Firm* — KPPB LLP

(57) ABSTRACT

A charged-particle source for generating a charged-particle comprises a sequence of electrodes, including an emitter electrode with an emitter surface, a counter electrode held at an electrostatic voltage with respect to the emitter electrode at a sign opposite to that of the electrically charged particles, and one or more adjustment electrodes surrounding the source space between the emitter electrode and the counter electrode. These electrodes have a basic overall rotational symmetry along a central axis, with the exception of one or more steering electrodes which is an electrode which interrupts the radial axial-symmetry of the electric potential of the source, for instance tilted or shifted to an eccentric position or orientation, configured to force unintended, secondary charged particles away from the emission surface.

20 Claims, 10 Drawing Sheets

(56) References Cited

U.S. PATENT DOCUMENTS

| | | |
|---|---|---|
| 1,903,005 A | 3/1933 | McCuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 5,103,101 A | 4/1992 | Berglund et al. |
| 5,189,306 A | 2/1993 | Frei |
| 5,260,579 A | 11/1993 | Yasuda et al. |
| 5,369,282 A | 11/1994 | Arai et al. |
| 5,393,987 A | 2/1995 | Abboud et al. |
| 5,399,872 A | 3/1995 | Yasuda et al. |
| 5,533,170 A | 7/1996 | Teitzel et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,866,300 A | 2/1999 | Satoh et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,107,636 A | 8/2000 | Muraki |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,443,699 B1 | 9/2002 | Mashey |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,768,123 B2 | 7/2004 | Giering |
| 6,768,125 B2 | 7/2004 | Platzgummer et al. |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,367,738 B2 | 5/2008 | Cleveland |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,683,551 B2 | 3/2010 | Miyamoto et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,178,856 B2 | 5/2012 | Nakayamada et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 8,736,170 B1 | 5/2014 | Liu et al. |
| 8,859,983 B2 | 10/2014 | Wieland |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,184,026 B2 | 11/2015 | Wieland |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 | 5/2017 | Platzgummer et al. |
| 9,691,589 B2 | 6/2017 | Van De Peut et al. |
| 9,799,487 B2 | 10/2017 | Platzgummer |
| 9,978,562 B2 | 5/2018 | Van De Peut et al. |
| 10,325,756 B2 | 6/2019 | Platzgummer |
| 10,325,757 B2 | 6/2019 | Platzgummer et al. |
| 10,410,831 B2 | 9/2019 | Platzgummer |
| 10,522,329 B2 | 12/2019 | Platzgummer et al. |
| 10,651,010 B2 | 5/2020 | Platzgummer et al. |
| 10,840,054 B2 | 11/2020 | Platzgummer et al. |
| 2001/0028038 A1 | 10/2001 | Hamaguchi et al. |
| 2002/0021426 A1 | 2/2002 | Mei et al. |
| 2002/0036264 A1 | 3/2002 | Nakasuji et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0056207 A1 | 3/2004 | Petrov et al. |
| 2004/0058536 A1 | 3/2004 | Ki |
| 2004/0119021 A1 | 6/2004 | Parker et al. |
| 2004/0119023 A1 | 6/2004 | Nakasuji et al. |
| 2004/0157407 A1 | 8/2004 | Qin-Yi et al. |
| 2004/0169147 A1 | 9/2004 | Haruhito et al. |
| 2005/0001178 A1 | 1/2005 | Parker et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1 | 9/2008 | Wagner et al. |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1 | 10/2009 | Pierrat et al. |
| 2009/0256075 A1 | 10/2009 | Kemen et al. |

(56) References Cited

U.S. PATENT DOCUMENTS

| | | |
|---|---|---|
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0049393 A1 | 3/2011 | De Boer et al. |
| 2011/0053087 A1 | 3/2011 | Nielsen et al. |
| 2011/0073782 A1 | 3/2011 | Wieland |
| 2011/0084219 A1 | 4/2011 | Adamec et al. |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0286173 A1 | 11/2012 | Van De Peut et al. |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat et al. |
| 2013/0157198 A1 | 6/2013 | Yoshikawa et al. |
| 2013/0161511 A1 | 6/2013 | Karimata et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264085 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer et al. |
| 2016/0284509 A1 | 9/2016 | Matsumoto |
| 2016/0336147 A1 | 11/2016 | Platzgummer |
| 2016/0349626 A1 | 12/2016 | Matsumoto |
| 2017/0032926 A1 | 2/2017 | Miyamoto |
| 2017/0154750 A1 | 6/2017 | Sato |
| 2017/0357153 A1 | 12/2017 | Platzgummer |
| 2018/0019094 A1 | 1/2018 | Iwata |
| 2018/0108516 A1* | 4/2018 | Umezawa ............... H01J 37/08 |
| 2018/0218879 A1 | 8/2018 | Platzgummer et al. |
| 2019/0066976 A1 | 2/2019 | Platzgummer et al. |
| 2019/0088448 A1 | 3/2019 | Platzgummer et al. |
| 2019/0214226 A1 | 7/2019 | Platzgummer et al. |
| 2019/0237288 A1 | 8/2019 | Platzgummer et al. |
| 2020/0348597 A1 | 11/2020 | Hochleitner et al. |
| 2022/0384143 A1 | 12/2022 | Platzgummer et al. |

FOREIGN PATENT DOCUMENTS

| | | |
|---|---|---|
| EP | 0178156 A2 | 4/1986 |
| EP | 0928012 A2 | 7/1999 |
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2190003 A2 | 5/2010 |
| EP | 2214194 A1 | 8/2010 |
| EP | 2312609 A1 | 4/2011 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| EP | 3070528 A1 | 9/2016 |
| EP | 3460824 A1 | 3/2019 |
| EP | 3460825 A1 | 3/2019 |
| EP | 3518268 A1 | 7/2019 |
| GB | 736995 A | 9/1955 |
| GB | 2349737 A | 11/2000 |
| JP | 4891970 A | 11/1973 |
| JP | 1315934 A | 12/1989 |
| JP | 3155029 A | 7/1991 |
| JP | 3297041 A | 12/1991 |
| JP | 08213301 A | 8/1996 |
| JP | 2004349168 A | 12/2004 |
| JP | 2006019436 A | 1/2006 |
| JP | 2006332289 | 12/2006 |
| JP | 2007172862 A | 7/2007 |
| JP | 2010098275 A | 4/2010 |
| JP | 2014175104 A | 9/2014 |
| WO | 200024030 A2 | 4/2000 |
| WO | 2001019922 A1 | 2/2001 |
| WO | 2006084298 A1 | 8/2006 |
| WO | 2008017982 A2 | 2/2008 |
| WO | 2008053140 A1 | 5/2008 |
| WO | 2009147202 | 12/2009 |
| WO | 2012172913 A1 | 12/2012 |

OTHER PUBLICATIONS

European Search Report for Application 08450077.6, report dated Jan. 29, 2010, 2 pgs.

European Search Report for Application 09450211.9-1226; report dated Sep. 14, 2010; 4 pgs.

European Search Report for application 09450212.7; dated Sep. 28, 2010, 9 pgs.

European Search Report for Application 141501197.7, report dated Jun. 6, 2014, 2 pgs.

European Search Report for U.S. Appl. No. 14/165,967, report dated Oct. 30, 2014, 2 pgs.

European Search Report for U.S. Appl. No. 14/165,970, report dated Jun. 18, 2014, 2 pgs.

European Search Report for U.S. Appl. No. 14/170,611, report dated Nov. 4, 2014, 3 pgs.

European Search Report for U.S. Appl. No. 14/176,563, report dated Jan. 14, 2015, 2 pgs.

European Search Report for U.S. Appl. No. 14/177,851; report dated Oct. 16, 2014; 1 page.

European Search Report for U.S. Appl. No. 14/199,183, report dated Jun. 19, 2015, 2 pgs.

European Search Report for Application 15159397.7, report dated Sep. 28, 2015, 7 pgs.

European Search Report for Application 15159617.8, report dated Oct. 19, 2015, 3 pgs.

European Search Report for U.S. Appl. No. 15/164,770, report dated Sep. 18, 2015; 2 pgs.

European Search Report for U.S. Appl. No. 15/164,772, report dated Sep. 11, 2015, 2 pgs.

European Search Report for U.S. Appl. No. 15/169,632, report dated Oct. 20, 2015, 3 pgs.

European Search Report for U.S. Appl. No. 15/171,348, report dated Oct. 30, 2015, 2 pgs.

(56) References Cited

OTHER PUBLICATIONS

European Search Report for EP 14176645, completed Dec. 1, 2014, 1 pg.
European Search Report for EP Application No. 16174185, Search Completed Dec. 6, 2016, 2 pgs.
European Search Report for European Application 10450070.7 dated May 7, 2012, 13 pgs.
European Search Report for European Application No. 16160622, Search completed Jul. 21, 2016, dated Jul. 21, 2016, 3 pgs.
European Search Report for European Application No. 19172550.6, Search completed Dec. 11, 2019, 1 Pg.
European Search Report for European Application No. 16160621, Report Completed Oct. 5, 2016, 3 pgs.
Extended European Search Report for European Application No. 16169216.5, Search completed Sep. 21, 2016, dated Sep. 29, 2016, 12 pgs.
Extended European Search Report for European Application No. 17153506, Search completed Oct. 5, 2017, dated Oct. 16, 2017, 2 pgs.
Extended European Search Report for European Application No. 17187922.4, Search completed Feb. 21, 2018, dated Mar. 6, 2018, 7 pgs.
Extended European Search Report for European Application No. 17191553.1, Search completed Mar. 22, 2018, dated Apr. 9, 2018, 5 pgs.
Extended European Search Report for European Application No. 18150797.1, Search completed Jun. 29, 2018, dated Jul. 9, 2018, 8 pgs.
Extended European Search Report for European Application No. 18154140.0, Search completed Aug. 16, 2018, dated Sep. 4, 2018, 5 pgs.
Extended Search Report for European Application No. 20171308.8, Search completed Oct. 30, 2020, dated Nov. 12, 2020, 17 pgs.
"Dither", Wikipedia, Retrieved from https://en.wikipedia.org/w/index.php?title=Dither&oldid=762118152 on Oct. 5, 2017.
"Ordered dithering", Wikipedia, Retrieved from https://en.wikipedia.org/w/index.php?title=Ordered_dithering&oldid=759840417 on Oct. 5, 2017.
Berry et al., "Programmable aperture plate for maskless high-throughput nanolithography", J. Vac. Sci. Technol., Nov./Dec. 1997, vol. B15, No. 6, pp. 2382-2386.
Borodovsky, "EUV, EBDW-ARF Replacement or Extension?", KLA-Tencor Lithography User Forum, Feb. 21, 2010, San Jose, CA, USA, 21 pgs.
Borodovsky, "MPProcessing for MPProcessors", SEMATECH Maskless Lithography and Multibeam Mask Writer Workshop, May 10, 2010, New York, NY, USA, 35 pgs.
Disclosed Anonymously, "Multi-tone rasterization, dual pass scan, data path and cell based vector format", IPCOM000183472D, printed from ip.com PriorArtDatabase, published May 22, 2009, 108 pages.
Hinterberger, "Ion optics with electrostatic lenses", University of Bonn, Germany, 2006, 18 pgs.
Huber et al., "Computing Straight Skeletons and Motorcycle Graphs: Theory and Practice", Thesis, Univ. of Salzburg (Austria) Jun. 2011, 134 pgs.
Eder Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8, doi:10.1088/0960-1317/21/4045038.
Kim et al., "Binary-encounter-dipole model for electron-impact ionization", Physical Review A, Nov. 1994, vol. 50, No. 3, pp. 3954-3967.
Li et al., "Through-Silicon Interposer Technology for Heterogeneous Integration", Future Fab Intl., Issue 45 (Apr. 25, 2013), 6 pgs.
Palfrader et al., "Computing Mitered Offset Curves Based on Straight Skeletons", Computer-Aided Design & Applications, vol. 12, No. 4, Feb. 11, 2015, pp. 414-424, http://dx.doi.org/10.1080/16864360.2014.997637.
Paraskevopoulos et al., "Scalable (24—140 Gbps) optical data link, well adapted for future maskless lithography applications", Proc. SPIE vol. 7271, 72711 I (2009), 11 pgs., doi: 10.1117/12.811495.
Platzgummer et al., "eMET—50keV electron Mask Exposure Tool Development based on proven multi-beam projection technology", Proc. of SPIE, 2010, vol. 7823, pp. 782308-1 -782308-12, doi: 10.1117/12.811495.
Platzgummer et al., "eMET POC: Realization of a proof-of-concept 50 keV electron multibeam Mask Exposure Tool", Proc. of SPIE, 2011, vol. 8166, pp. 816622-1-816622-7, doi: 10.1117/12.895523.
Shih, "Image processing and mathematical morphology: fundamentals and applications", CRC Press, 2009, pp. 26-32.
Vink et al., "Materials with a high secondary-electron yield for use in plasma displays", Applied Physics Letters, Mar. 25, 2002, vol. 80, No. 12, pp. 2216-2218, DOI: 10.1063/1.464229.
Wheeler et al., "Use of Electron Beams in VLSI", G.E.C.Journal of Science and Technology, General Electric Company. Wembley, Middlesex, GB, vol. 48, No. 2, Jan. 1, 1982, pp. 103-107, XP000820522.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860, DOI: 10.1116/1.2366677.
Extended European Search Report for European Application No. 21175588.9, Search Completed Nov. 8, 2021, dated Nov. 16, 2021, 12 Pgs.

* cited by examiner

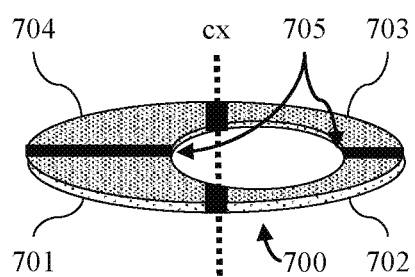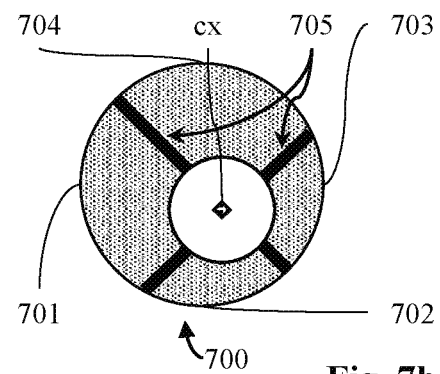
Fig. 7a
Fig. 7b

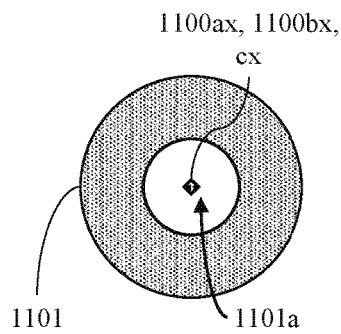
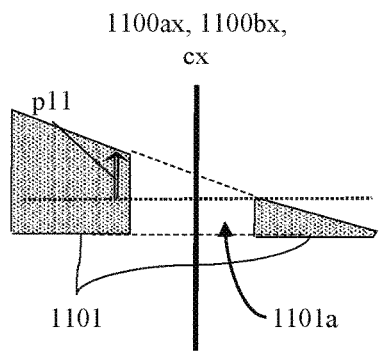
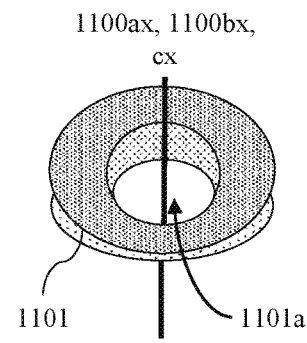
Fig. 11a  Fig. 11b  Fig. 11c
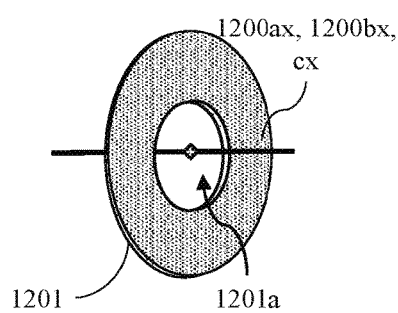
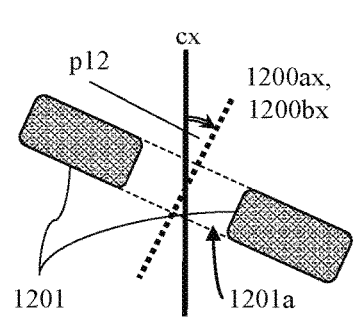
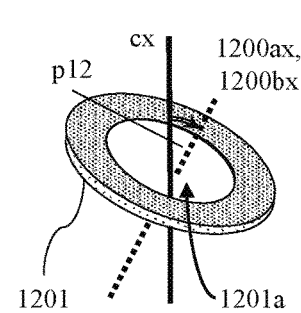
Fig. 12a  Fig. 12b  Fig. 12c
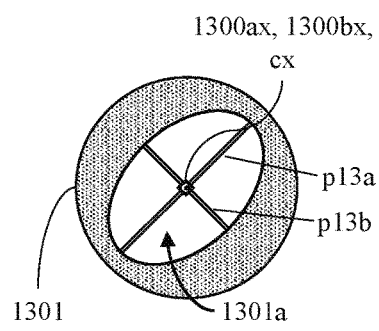
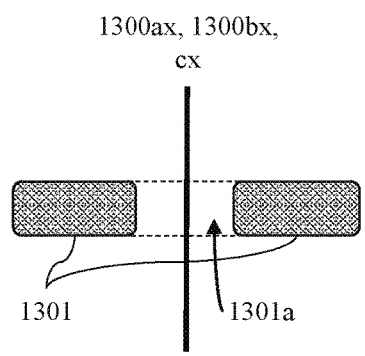
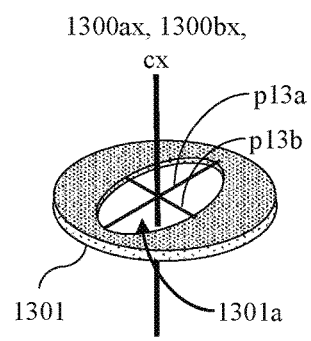
Fig. 13a  Fig. 13b  Fig. 13c

CHARGED-PARTICLE SOURCE

CROSS-REFERENCED APPLICATIONS

This application claims priority to European patent application EP 20171308.8 filed on Apr. 24, 2020. The disclosures of which are included herein by reference in its entirety.

FIELD OF THE INVENTION

The present invention relates to a charged-particle source which is suitable for use in, or as part of, charged-particle nano-pattering or inspection tools, in particular of the multi-beam type.

BACKGROUND

Charged particle sources are used, for instance, as sources to generate a particle beam in a charged-particle multi-beam tool for nano-pattering or inspecting semiconductor substrates.

The applicant has realized charged particle multi-beam apparatuses and developed corresponding charged particle optics, pattern definition devices, and multi-beam writing methods, in particular a 50 keV electron multi-beam writer to realize leading-edge complex photomasks for 193 nm immersion lithography, of masks for EUV lithography and of templates for nanoimprint lithography. The applicants system is called eMET (electron Mask Exposure Tool) or MBMW (multi-beam mask writer) and used for exposing 6" mask blank substrates and has also been called PML2 (Projection Mask-Less Lithography) for electron beam direct writer (EBDW) applications on silicon wafer substrates. The multi-beam column and writing method can also be used for multi-beam inspection applications.

FIG. 2 shows a schematic view of a lithography apparatus of multi-beam writer type and its main components. Lithographic apparatuses of this type are well known in prior art, such as U.S. Pat. No. 6,768,125, EP 2 187 427 A1 (=U.S. Pat. No. 8,222,621) and EP 2 363 875 A1 (=U.S. Pat. No. 8,378,320) of the applicant. In the following, only those details are given as needed to describe the invention to enable one of ordinary skill in the art to implement the invention; for the sake of clarity, the components are not shown to size in FIG. 2.

The main components of the lithography apparatus 1 are—corresponding to their position along the optical axis cx of a charged particle beam, which in this example runs vertically downward—an illumination system 3, a pattern definition system 4, a projecting system 5, and a target station 6.

The whole apparatus 1 is contained in a vacuum housing 2 and generally, but not exclusively, held at high vacuum to ensure an unimpeded propagation of the beam. The term "high vacuum" is used herein to denote a vacuum at a pressure below $0.1 \times 10^{-3}$ Pa. It is emphasized that, even with the interior of the housing 2 being at high vacuum, residual gas particles remain.

The pattern definition device divides the beam into two portions, an illumination beam ib and a patterned beam pb. The charged particle optics of the apparatus, namely, the illumination system 3 and the projection system 5, are realized using electrostatic and/or magnetic lenses.

The illumination system 3 in this instance comprises a charged particle source 7, which is one subject of this invention, an alignment system 8, as well as a condenser lens system 9. It should be noted that, while the apparatus realized by the applicant uses electrons, in general any electrically charged particles can be used where sources for theses charged particles are available, for example hydrogen ions or heavier ions, charged atom clusters, or charged molecules.

Without any loss of generality the following description will refer to a charged particle source for electrons, thus charged particles with positive electric charge are considered to be of opposite charge. This will simplify the explanations, while any skilled person can modify the description, for example to arrange for an apparatus using ions instead by mirroring all electric charges.

The alignment system 8 coordinates the beam of a defined energy, typically several keV, e.g. 5 keV, onto the central axis cx. By means of a condenser lens system 9, the particles emitted from the source 7 are formed into a wide particle beam 50 serving as the illumination beam ib. This illumination beam ib then irradiates a pattern definition system 4 which comprises a number of plates with a plurality of openings, referred to as apertures 24 (FIG. 3). The pattern definition system 4 is held at a specific position in the path of the illumination beam ib, which thus irradiates the plurality of apertures and is split up into a number of small beams or rays, which are referred to as "beamlets".

Referring to FIG. 3, some of the apertures 24 of the pattern definition system 4 are "switched on" or "open" so as to be transparent to the incident beam in the sense that they allow the portion of the beam (beamlets 51) that is transmitted through it to reach a target 16; the other apertures are "switched off" or "closed", i.e. the corresponding portion of the beam (beamlets 52) cannot reach the target, and thus effectively these apertures are considered non-transparent (opaque) to the beam.

Emerging from the pattern definition system 4, the illumination beam ib is structured into a patterned beam pb, as a pattern of switched-on apertures—the only portions of the pattern definition system 4 which are transparent to the illumination beam ib where the apertures are chosen according to a pattern which is to be exposed on the target 16. It has to be noted that the "switching on/off" of the beamlets usually is realized by some sort of deflection. This may be achieved by a deflection arrangement provided in one of the plates of the pattern definition system 4: "Switched off"-beamlets are deflected by a small angle, so they cannot reach the target, but are merely absorbed somewhere in the lithography apparatus, e.g. by an absorbing plate 11 (also called stopping aperture plate).

The pattern as represented by the patterned beam pb is then projected by means of an electro-magneto-optical projection system 5 onto the target 16, where it forms an image of the "switched-on" apertures. The projection system 5 also implements a demagnification, for instance of scale 200:1, and the beam may also have several crossovers, for instance two crossovers c1, c2 as shown in FIG. 2, to finally form smaller images on the target. The target (also referred to as "substrate" or "mask") may, for example, be a 6" mask blank or a silicon wafer covered with a particle-sensitive resist layer 17. The target is held by a chuck 15 and positioned by a target stage 14, both comprised in the target station 6.

Operations of particle-beam writing or inspection apparatuses, such as the lithography apparatus 1 and related processing and writing methods, are made public by the applicant, for example in U.S. Pat. Nos. 9,053,906, 6,768,125, 8,222,621 and 8,378,320 of the applicant; the disclosure of these documents is herewith included by reference.

One important parameter of the beam, which is monitored and controlled throughout the operation of the apparatus, is the current density, i.e. the amount of charged particles per time that flows through an area of a chosen cross section; it defines a dose rate onto the target. Preserving the current density can stabilize its operation. A dose rate of each beamlet reaching the target is associated to a local current density of the beam, with respect to a plane orthogonal to the optical symmetry-axis cx of the apparatus, and is in a first approximation a function primarily depending on the radial distance from the optical axis. In general, a current density is a rotational symmetric function, to which deficiencies will add local position-dependent components, which for example can arise from local anisotropies. The latter may be for example: inhomogeneities of the electrodes, contaminations within the apparatus, or residual gases and ions present in the housing 2 and many others. Methods for reducing dose rate errors, such as a difference between the designed and operational dose rates, are explained, for instance, in U.S. Pat. Nos. 9,053,906, 6,768,125, 8,222,621 and 8,378,320.

Particles and ions, for example emerging from residual gases or electrode surfaces, can affect the life span of the emitter electrode, for instance by enhancing erosion of emitting material, contaminations, and/or adding defects to the structure. Operation of the system at a high vacuum can reduce these effects, but not fully eliminate them. Deficiencies of the charged particle source coming from contaminations of the emitter electrodes surface and/or shallow defects of the structure can be reduced by processing the surface. Removal of contaminants from the emitter electrodes surface and/or reducing the sputtering of said surface can increase efficiency and the operational time of the apparatus. One can utilize, for example, residual gases and/or inject specific gases for purposes of a method of cleaning the charged particle source for instance, as described in applicant's EP 3 518 268 (=US 2019/0237288), or deliberately sputter the surface of the electrodes, for instance the surface of the emitter electrode to a certain level.

Contaminations of the surface and sputtering from residual particles in the source space may be aggravated by the design of the source, for example as oppositely charged particles will be subject to reversely directed forces originating from electric fields. Therefore, the electric field in vicinity of the emitter surface, which is meant to direct and accelerate the emitted charged particles, will be also acting on oppositely charged particles in reversed direction. As the extracting electric fields and acceleration of particles takes place within the source space, it is that this volume is of concern, for example to the charged particle source design process. Therefore, inside the source space, any charged particles carrying opposite charge with respect to the charged particles the source is designed for, will likely be projected onto the emitter electrodes surface.

SUMMARY OF THE INVENTION

Various embodiments are directed to a source for emission of electrically charged particles, in particular electrons, as a charged-particle beam along a direction of emission, with the charged-particle source comprising
a housing connectable to a vacuum system, allowing the charged-particle source being operated at a high vacuum, an emitter electrode (i.e., an emitter anode or cathode, depending on whether the charged particles carry positive or negative electric charge, respectively), which emitter electrode has an emitter surface configured to emit charged particles of a specific charged particle species (such as electrons, but alternatively also ions are possible, in particular ions carrying a positive electric charge) along the direction of emission, a counter electrode configured to being applied an electrostatic voltage with respect to the emitter electrode at a sign opposite to that of the electrically charged particles, the counter electrode having an emitter aperture at a location downstream of the emitter surface along the direction of emission, and a space between the emitter electrode and the counter electrode, also referred to as the source space.

In particular, such a particle source is preferably operable in an emission mode, wherein charged particles are emitted from the emission surface and a voltage is applied between the emitter electrode and the counter electrode, causing an electric field and thus a force acting on the charged particles, to accelerate at least part of the charged particles towards the counter electrode and through the aperture along the direction of emission. Usually, but not necessarily, the direction of emission coincides with an axis of a basic overall rotational symmetry ("central axis") of the charged particle source. In order to better control emission and cleaning operation modes, the charges particle source of the type discussed here will usually have at least one adjustment electrode located surrounding the source space between the emitter electrode and the counter electrode, and each adjustment electrode being configured to being applied a controlled electrostatic voltage with respect to the emitter and/or counter electrode.

It is one object of this invention to provide a charged particle source with a design optimized towards increasing the sources operational time, and thus increasing the overall operational time of the apparatus in which the source is used. At the same time, it is desired to maintain generation of a homogenous beam, symmetric electric current density distribution and an overall stability of the emission current, which avoids the need to disassemble the source in case of non-optimal operation of the source due to, e.g. non-alignment with the direction of emission, and in particular without physically removing the charged particle source 7 from the particle-beam apparatus 1.

A further goal is to protect the emitter surface from unintended processes of source degeneration in general, e.g. sputtering and erosion through secondary counter charged particles from residual gases other contaminants in the source space, as secondary (and unintended) charged particles are through above mentioned deflected paths redirected away from the emission surface.

In order to set aside the above-mentioned problems the inventors propose to introduce elements whose configuration intentionally breaks rotational symmetry, for example by shifting or tilting electrodes or introducing other perturbations to the general rotational axial symmetry of the extraction system. By virtue of this breaking of rotational symmetry a modified distribution of the electric potential is obtained within the source, which will, in consequence, alter the trajectories of the particles. Throughout this disclosure, the terms "rotational symmetry" and "radial symmetry" are used interchangeably to denote a geometric symmetry of an object (which object is, for instance an electrode or an arrangement of electrodes in a particle source) where with respect to an axis of rotation (such as the center axis) a rotation about the axis of symmetry by an arbitrary angle does not change the geometry of the object with respect to its surrounding. As mentioned above, the direction of emission may coincide with the axis of basic overall rotational symmetry. In many embodiments of the invention, the axis of rotational symmetry will coincide with an axis of symmetry of the emitter aperture.

Thus, while the electrodes in the charged-particle source generally have a basic overall rotational symmetry along a central axis, there is at least one "steering electrode", namely, an electrode which interrupts the (basic) overall radial axial-symmetry of the geometry of the source, for instance by being shifted and/or tilted to an eccentric position or orientation. As a consequence of this geometric deviation from radial symmetry, the radial symmetry of the electrostatic potential will be broken, which can serve to force unintended, secondary charged particles away from the emission surface. Within this disclosure, the term "steering electrode" is always meant to indicate this type of electrode.

Non-rotational symmetric layouts and perturbations are described in Munro E., "Finite difference programs for computing tolerances for electrostatic lenses", J. of Vacuum Science & Technology B, 1988, pp. 941-948. Within this disclosure, charged-particle sources in accordance with the present invention with novel extraction systems will usually operate within a regime which corresponds to what is described in Munro E., op.cit.

It should be appreciated, though, that perturbations and changes of an electric potential will affect any charged particle, be it "intended" or not. A perturbation which deflects a charged particle away from the emitters electrode surface, will thus also deflect the oppositely charged particles. This may be a challenge when designing a properly functioning configuration, as the operation and quality features of the source have to be maintained even when perturbations and deflections of the beam are introduced.

The invention proposes to intentionally give up on a complete rotational symmetric configuration, which is realized by breaking the symmetry of the shape and/or orientation of electrodes, for example with eccentric or tilted apertures. This will also lead to synergetic effects, such as significant improvement in protection of the emission surface and preserving the beam properties. The present invention synergistically combines several perturbation techniques by a smart exploitation of features of configuration, whilst preserving desired properties, such as homogenous and stable current density and emission of a radially axis-symmetric charged particle beam from the charged particle source. It is an advantage of the present invention to maintain desired functionality through deflections of particles, for example away from an area that is to be protected, for instance an emission area on the emitter electrodes surface.

The charged particle sources according to the invention comprises a surface on the emitter electrode from which the charged particles will emerge; this surface is referred to as "emission surface", or also "area to be protected" since it is a vital component of the source. Properties of the surface will have immediate influence on the beam, in particular its homogeneity and current density distribution. Therefore one goal of this invention is to preserve the state of the surface throughout an operational mode of the source.

In other words, the present invention proposes that the charged particle source be provided with electrodes which are specifically configured with deviations from a geometrically radial symmetric design to generate localized deflections of charged particles by perturbations of multipole character, which will effect counter charged particles in mutually opposite ways. Hereinafter, this type of electrodes having specific intentional deviations from radial symmetry, are referred to as "symmetry breaking electrodes" or, shorter, "steering electrodes". These steering electrodes will cause an intentional distortion of the path of the charged particles from the straight line corresponding to the direction of emission, as would be the case in a rotational symmetric source.

Herein, the term "basic overall symmetry", in particular "basic overall rotation al symmetry", is used to indicate that the particle source, as seen as a whole, is shaped with a general symmetry (neglecting, of course, deviations which are due to inaccuracies within allowed tolerances), with the exception of a few components of the particle source which may have certain deviations from the symmetry in question, in particular rotational symmetry, thus breaking the overall symmetry, albeit by small amounts (small angles or small distances, respectively), i.e. by amounts which cause changes in position which are smaller than the typical dimensions of the source by at least one order of magnitude.

Another aspect of the invention may further include a control electrode of "Wehnelt" type, also referred to herein as suppressor electrode. Such a Wehnelt electrode is typically located between the emitter electrode and counter electrode, preferably closer to the emitter electrode. It is applied an electric potential within a range close to potential of the emitter electrodes (i.e., closer than to the potential of other electrodes). It will have an aperture at a location downstream of the emitter electrode along the direction of emission of charged particles. A purpose of the Wehnelt electrode is to control and focus the emitted particles.

For shaping and focusing of the beam, additional electrodes may be introduced between the emitter and the counter electrode. These additional electrodes are provided with apertures at a location downstream of the emitter electrode, along the direction of emission of charged particles, and are held at suitable electric potentials respectively. Where the electric potential of at least one electrode differs from the emitter electrodes and/or counter electrodes potential, it will result in a lensing effect on the beam. Thus the electrode stack may also be called a "lens"; in this disclosure, the term lens always refers to an electrooptical lens or magnetooptical lens.

The improvements for the life time of the source, i.e. extending its operational time, are mainly intended to protect said emission surface from harm, which arises for example through secondary charged particles, that are for instance coming from interaction processes, residual gases or emission from other surfaces in the source space.

According to the present invention the source includes one or more "steering electrodes". A steering electrode is a modified type of "adjustment electrodes" and may be added to a source or replace existing electrodes of the design. The term "adjustment" refers to e.g. the adjustable spatial position, the adjustable electric potential during any mode of operation of the source and/or adjustment of certain design parameters, e.g. thickness, aperture radii or materials. The term "steering electrode" alludes to the capability of the relevant electrodes with respect to modulating properties of the charged particle beam, e.g. charged particles trajectories, beam spatial profiles and distribution of particle density in the beam.

Any number of the electrodes may be implemented as steering electrodes. Examples are in particular (but not exclusively) stepped, tilted, elliptical or shifted configurations, and the electrodes aperture may be of cylindrical or coned shape. Furthermore any versions of these shapes that are tilted with respect of the overall central axis cx of the charged-particle beam apparatus 1, are possible.

Thus, in accordance with one aspect of the invention, a charged-particle source of the type as mentioned in the beginning, with a basic overall rotational symmetry along the central axis further comprises at least one adjustment electrode, which is a steering electrode which interrupts the radial axial-symmetry of the electric potential of the source, configured to force unintended, secondary charged particles away from the emission surface.

In accordance with a second aspect of the invention, a charged particle source further comprises a suppressor electrode of Wehnelt type being located between the emitter electrode and the counter electrodes—preferably located closer to the emitter electrode than to the counter electrode—and this suppressor electrode is configured to being applied a control voltage with regard to the emitter electrode, which is opposite to that of the counter electrode with regard to the emitter electrode, and having an aperture at a location downstream of the emitter electrode along said direction of emission. Furthermore, the suppressor electrode may be an electrode deviating from the general radial axial symmetry of the source, i.e. it is a steering electrode; specifically in some embodiments, the suppressor electrode may be (i) a "shifted suppressor", which is an electrode having an axis of symmetry which is positioned at a given (i.e., intentionally introduced and non-vanishing) displacement with respect to the central axis, and/or (ii) a "tilted suppressor", which is an electrode having an axis of symmetry which is positioned inclined with a given (i.e., intentionally introduced and non-null) angle with respect to the central axis.

This charged particle source may also include at least one adjustment electrode, located surrounding the source space between the emitter electrode and the counter electrode, which adjustment electrode(s) is/are configured to being applied a controlled electrostatic voltage with respect to the emitter and/or counter electrode, wherein at least one adjustment electrode is a steering electrode which interrupts the radial axial-symmetry of the electric potential of the source, configured to force unintended, secondary charged particles away from the emission surface.

For both of the just-mentioned aspects, various realizations of the one or more steering electrode(s) are possible, which each correspond to a specific type of defining parameter of the (non-vanishing) deviation from radial symmetry, namely, a steering electrode which is a displacement electrode, namely, an electrode comprising an aperture, the aperture extending along an aperture axis, the aperture axis being located displaced from the central axis by a predetermined or adjustable distance; this distance is the defining parameter with this type of steering electrode.

a steering electrode which is a sheared electrode, namely, an electrode comprising an aperture, the aperture extending along an aperture axis, the aperture axis being tilted from the central axis by a predetermined or adjustable angle; this angle is the defining parameter with this type of steering electrode.

a steering electrode which is a ramped electrode, namely, an electrode comprising an aperture and having a varying thickness as measured along the direction of the central axis, said thickness varying between a minimal and a maximal value, which differ by a predetermined or adjustable maximal step size, when measured at positions opposite to each other with respect to the central axis; this step size is the defining parameter with this type of steering electrode.

a steering electrode which is a tilted electrode, namely, an electrode comprising an aperture and having a body axis which is tilted from the central axis by a predetermined or adjustable angle; this angle is the defining parameter of design with this type of steering electrode.

a steering electrode which is an elliptical electrode, namely, an electrode having an aperture of substantially elliptical shape (including ovoid shapes), said shape being described by the lengths of the two orthogonal main axes, and the ratio of said lengths of the two orthogonal main axes ($r13=p13a/p13b$) being different from 1; the deviation of this ratio from 1 is the defining parameter with this type of steering electrode.

In many embodiments of the invention, more than only one steering electrode may be present, with the steering electrodes of same type, but also any combination of steering electrodes of various types may be implemented. In an advantageous development of the invention, two or more steering electrodes are combined so as to enhance their effect on the undesired secondary particles while mutually reducing the impact on the primary particles of the particle beam generated. For instance, the inventors found that a combination of a displacement electrode and a tilted electrode may be particularly advantageous. More specifically, this displacement electrode may be located downstream of this tilted electrode, as seen along the direction of emission; and moreover said displacement electrode may located immediately after the tilted electrode, i.e. with no one of the other electrodes intervening. The tilted electrode may be the first electrode downstream after the emission electrode, as seen downstream along the direction of emission.

In an advantageous development of the invention, a steering electrodes may be a split electrode which is composed of at least two sectorial electrodes, said sectorial electrodes being separated by gaps consisting of vacuum or dielectric materials. The sectorial electrodes of the split electrode are preferably individually connected to a voltage supply system and configured to be applied mutually different electric potentials. The voltage supply system is often realized as a voltage supply unit providing the plurality of electrostatic voltages for the sectorial electrodes of a split electrode, but it is also possibly to use a plurality of supply units for implementing the voltage supply unit.

Furthermore, in order to provide for an adjustability of an electrode, and in particular steering electrode, such electrode may be provided with actuators, such as piezo-electric actuators, for adjusting the position of the electrode. These actuators may be controlled through via control units and controllable spacers, on a mounting interface and/or similar electrode carriers. These actuators may be configured to shift and/or tilt the electrode with respect to the central axis, for instance along axes parallel and/or perpendicular to the central axis. Furthermore, the bias potential to the piezo-electric actuator may be applied through the respective control unit and from a voltage supply unit as a variable parameter; this voltage is preferably tuned in-situ, i.e. without disassembly of the source arrangement.

For mounting a steering electrode and allowing a simple way of adjustment around the central axis, a mounting device may be advantageous, where the steering electrode can be mounted on a mounting device of ring-like shape having a central opening, which is sufficiently wide to allow mounting the electrode while not obstructing an aperture of the electrode through which the charged particles (i.e., the beam) propagate. Furthermore, the electrode may comprise at least three connectors which can provide a connection to the mounting device; these three connectors are preferably located at corners of a triangle, preferably an isosceles triangle or equilateral triangle, and positionable on the ring-like shape, where the position of the electrode is adjustable on the ring-like shape with regard to its angular orientation along the ring-like shape (cf. FIGS. 16a, 16b).

In a further development of the invention, the emitter electrode may be realized as an electrode having an axis which is oriented at a predetermined angle with respect to the central axis and/or is shifted from the central axis at a predetermined displacement.

As already mentioned, the charged particle source according to the invention is intended for being mounted in a charged particle beam apparatus; preferably, in the mounted state the central axis of the source coincides with an overall axis of symmetry of said charged particle beam apparatus. More generally, the central axis of the source will define a primary direction of emission of charged particles into the charged particle beam apparatus. This primary direction will coincide with at least an initial portion of the nominal path of the charged particle beam within the apparatus.

The electrodes, and in particular the steering electrodes, or the charged particle source according to the invention may be manufactured by CNC-machining or equivalent.

BRIEF DESCRIPTION OF THE DRAWINGS

In the following, in order to further demonstrate the present invention, a discussion of illustrative and non-restrictive embodiments, as shown in the drawings, is presented. The drawings show:

FIG. 5a shows the basic radial symmetric arrangement as reference, and FIGS. 5b and 5c illustrate two stages of implementing steering electrode arrangements towards a configuration deflecting secondary particles away from an emission surface;

FIG. 6a shows the basic radial symmetric arrangement as reference (corresponding to FIG. 5a), and FIGS. 6b and 6c illustrate two stages of implementing steering electrode arrangements corresponding to FIGS. 5b and 5c, respectively;

FIGS. 7a and 7b show a split electrode, composed of four sectorial electrodes, in a perspective view (FIG. 7a) and a top view (FIG. 7b);

FIGS. 11a, 11b and 11c show a ramped electrode according to one embodiment of the invention, in a top view (FIG. 11a), a longitudinal section (FIG. 11b), and a perspective view (FIG. 11c);

FIGS. 12a, 12b and 12c show a tilted electrode according to one embodiment of the invention, in a top view (FIG. 12a) along the central axis, a longitudinal section (FIG. 12b), and a perspective view (FIG. 12c);

FIGS. 13a, 13b and 13c show an elliptical electrode according to one embodiment of the invention, in a top view (FIG. 13a), a longitudinal section (FIG. 13b), and a perspective view (FIG. 13c);

DETAILED DESCRIPTION OF EMBODIMENTS OF THE INVENTION

Figure 1:
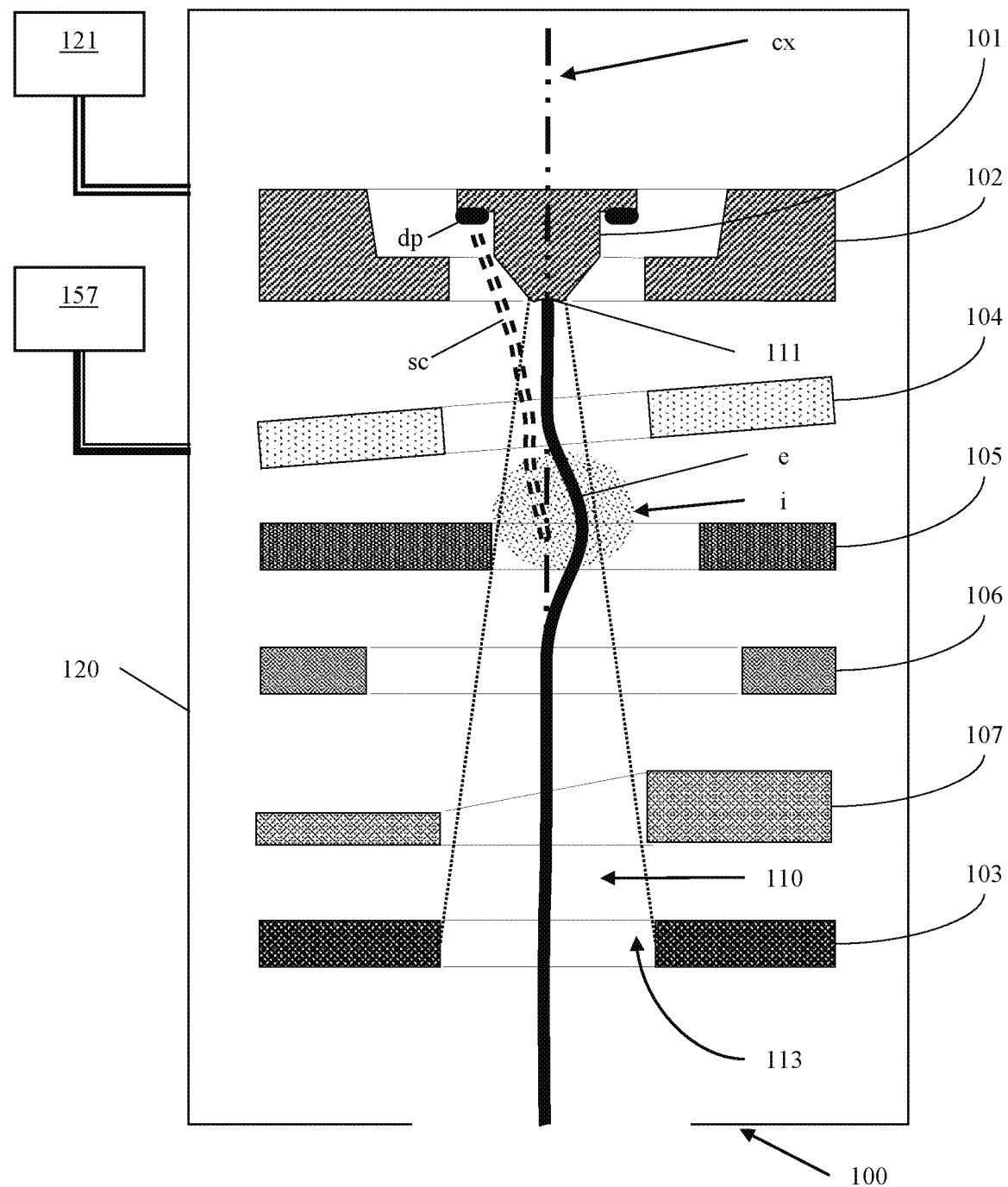
FIG. 1 a charged-particle source according to a first preferred embodiment of the invention, in a longitudinal sectional view, where the central axis is shown vertical, in which the mean paths of the primary and secondary particles are shown, and exemplary electrodes are of a steering electrode design.

The detailed discussion of exemplary embodiments of the invention given below discloses the basic concepts and further developments of the invention. Each example is provided in order to explain the invention and is not to be construed as limiting the invention. In particular, features illustrated or described as part of one embodiment can be used on or in conjunction with any other embodiment(s), thus yielding yet further embodiments. It is appreciated that the present disclosure includes such modifications and variations. It is to be noted that the invention is not restricted to the embodiments discussed in the following, which are given for exemplary, illustrative purpose and merely present suitable implementations of the invention.

Generally, same reference numbers refer to identical components. It will be appreciated Generally, in the description of consecutive drawings only the relative differences are described for brevity. The structures shown in the drawings are not depicted true to scale, but rather are shown as needed to appropriately explain the inventions and its embodiments. The description of the system is made with reference to polar coordinates, without limiting the present invention to that case.

The embodiments discussed here relate not only to a charged particle source, but also describe particular electrodes, and electrodes as part of a charged particle source. It will be evident to the person skilled in the art to freely combine several or all of the embodiments discussed here as deemed suitable for a specific application of the invention. Throughout this disclosure, terms like "for instance", "advantageous", "exemplary" or "preferred" indicate elements or dimensions which are particularly suitable (but not essential) to the invention or an embodiment thereof. These elements and dimensions may be modified wherever deemed suitable by a skilled person, except where expressly required otherwise.

Furthermore any parts, e.g. lines or curves in drawings, denoted as "paths" of particles, which also might be referred to as "rays" or "path of flight", are exemplary and given only for illustrative purposes. Behaviors of charged particles in a source of the invention, i.e. a direction, angle and or spread of particles, in the vicinity of presumed electric potentials are generalized to reduce complexity and simplifies the shown figures to a handy amount of information, from which any skilled person can identify the expected, desired behavior of the charged particles. This is not to obscure the fact that the actual paths may be more complicated, for which a more precise, physical calculation and evaluation of layouts may be required, but are not necessary to understand the principles underlying the invention.

A charged particle source may be configured to operate in one or more operation modes. First of all, generally it is operable in an emission mode, wherein a voltage is applied between the emitter and counter electrodes, causing generation of energetic charged particles emerging from the emission surface and travelling downstream along the direction of emission e (FIG. 1) towards the counter electrode, to result in a charged particle beam. Gases present in the source space may, for instance, arise from the (surrounding) atmosphere, including residual gases or be emitted from surfaces of the charged particle source itself. The energetic charged particles may ionize gases and ions can potentially interfere with the source, especially electrodes, e.g. through sputtering, contamination or erosion.

Any kind of particles (including unintended residual gas ions) may potentially lead to more charged particles, e.g. the emitted and accelerated charged particles from the emission surface, also referred to as "primary", will via interactions with residual gases and substances in the source space generate other charged particles, also referred to as "secondary", for example via ionization. A secondary charged particle, which term will hereinafter (and without any loss of generality) refer to secondary particles of opposite charge with respect to the primary charged particles, traversing the source space, in particular going along the path of flight of the primary charged particles, will be affected by the local electric fields and finally may be accelerated in the opposite direction to that of a primary particle. Thus, generally speaking, such a secondary particle will travel either towards the origin of the primary charged particles, i.e. the emission surface, or towards another surface in the source that is on a lower electric potential. On the other hand, particles of secondary origin having the same sign as the primary particles, might be travelling towards the apparatus setup in a downstream direction, e.g. towards the pattern definition system (see 4 in FIG. 2), depending local electrical fields and properties of particles, and will eventually interfere with the apparatus setup.

The implementation of steering electrodes serves to eventually direct the secondary charged particles away from the emission area of the emitter electrode, whilst the introduced perturbation onto the path of flight of the primary charged particles will be compensated by another steering electrode further downstream of the direction of emission. In other words the electrodes cause a non-rotationally symmetric extraction system, i.e. with respect to the basic overall rotational symmetry of the charged-particle beam apparatus, and thus introducing a perturbation of the electric potential and thus the derived electric fields which influence the charged particles. As a consequence, the lines of electric potential have a certain deviation from rotational symmetry, i.e. they are "steering off" the axis of rotational symmetry and thus breaking the overall rotational symmetry; this results in additional forces to the particles which (by way of Coulomb interactions) will not degrade the primary lithography beam (lb), but mainly redirect the secondary counter beam (sc). As one effect, the duration of the source is extended. Principally the emission surface is preserved from degradation due to negative effects of residual particles in the system.

The article by Munro E., op.cit., describes the computation of tolerances of electrostatic lens components by using finite difference programs, where those tolerances are unintended shifts, tilts and ellipticity of the manufactured electrodes of an electrostatic lens. That article describes the "Sturrock's principle" which states the effective change of potential as follows:

The effect of displacing a point P on the electrode surface through a small distance $\delta r_P$ can be simulated by changing the potential on the surface of the unperturbed electrode by an amount $\delta\Phi_P = -\nabla\Phi_P \cdot \delta r_P$.

A surface is described in polar coordinates (r, θ, z), where the gradient of the potential at any point P on the surface is given by $$\nabla\Phi_P = \frac{\partial\Phi}{\partial r}\cos\theta i + \frac{\partial\Phi}{\partial r}\sin\theta j + \frac{\partial\Phi}{\partial z}k$$

where (i, j, k) is the orthogonal base of coordinates on the surface, for example of the electrode. Which Munro E. then combines with the perturbations obtained from shifts, tilts and ellipticity into a perturbation potential δΦ from shifts of $$\delta\Phi = -\frac{\partial\Phi}{\partial r}\cos\theta\delta x$$

from tilts of $$\delta\Phi = \left[r\frac{\partial\Phi}{\partial z} - (z-z_c)\frac{\partial\Phi}{\partial r}\right]\cos\theta\delta\alpha$$

and from ellipticity of $$\delta\Phi = -\epsilon\frac{\partial\Phi}{\partial r}\cos 2\theta$$

The perturbations mentioned above are exploited as a steering-off small addition to the basic overall radial symmetric electrostatic potential. These perturbations are used to implement a charged particle source design, in which the secondary charged particles are deflected away from the area of emission on the emitter electrode.

For better clarity of the following description of embodiments of the invention, terms and concepts are explained below. Also the description of the system in polar coordinates is useful. The main component of the apparatus is the charged particle beam. Thus, it is useful to define a "central axis" (cx), i.e. the central axis of the tool, as the central axis of the source and one simple approximation of the beam in the figures it is denoted as the central axis (cx). However, the beam path may deviate from this axis to a certain extent, as further explained below.

The z-axis of the global polar coordinate system is identical with the central axis (cx). For the description of geometry of a specific component, a local coordinates system may be useful, in particular local polar coordinates, where the respective z-axis may be chosen to coincide with the central axis (cx) or an axis displaced and/or tilted from the central axis.

An electrode has a body, typically made of metal, or a metal covered material. An electrode will have an upper and lower face, with respect to direction of the beam, and an aperture to let the particle beam pass. A local "body axis" (bx) may be defined for the body of an electrode as a straight line defined as follows. The normal of the upper face at a center point thereof and the normal of the lower face at a center point thereof are determined; in case these two normal axes coincide, the local body axis is defined simply by one of the normals (arbitrary choice). In case these two normals do not coincide, they are averaged to obtain the local body axis. More in detail, in case the two normals are parallel, the middle parallel is taken as local body axis; otherwise the direction of the local body axis is the arithmetic average of the direction vectors of the two normals, and the local axis passes through the point of intersection or through the middle point of the closest distance of the two normal.

The thickness of the body is the distance between the upper and lower face. The thickness can be a function of position and a parameter of design. Typically the body axis will coincide with the central axis (cx).

The aperture of the electrode will be also described using polar coordinates, and thus with a designated z-axis—the aperture axis (ax), which is locally defined for each aperture as the straight line connecting the center of the aperture on the upper face with that on the lower face. Also the shape of the aperture may change along the aperture axis. In most cases the aperture axis (ax) will coincide with the body axis (bx).

In prior art, many charged particles sources are designed for generation of rotational symmetric beams, and thus also electrodes, i.e. the bodies and apertures, are rotational symmetric. It is one aspect of this invention to exploit electrodes of non-rotational symmetric design. In other words, implementations of steering electrodes in the present invention employ intended perturbations of the rotational symmetry, i.e. breaking the rotational symmetry of the extraction system. Steering electrodes may be realized as
- displacement electrodes (FIG. 9), quantified by an offset of the aperture,
- sheared electrodes (FIG. 10), quantified by a tilt angle of the aperture,
- ramped electrodes (FIG. 11), quantified by a slope on the body's thickness,
- tilted electrodes (FIG. 12), quantified by a tilt angle of the body's axis,
- elliptical electrodes (FIG. 13), quantified by a ratio of the apertures scales, as well as any viable combinations of the above mentioned designs, including also any viable combinations of them with rotational symmetric designs of electrodes from prior art.

A steering electrode is usually one of the adjustment electrodes, but may also be one of the other electrodes of the source, e.g. the emitter electrode, suppressor electrode, counter electrode. In the following, specific configurations of steering electrodes are described, according to several embodiments of this invention:

Displacement electrodes are electrodes with an intentional displacement of their apertures axis (ax) from the body axis (bx), i.e. a mismatch of the axes by a parallel translation. The displacement is to deviate the electrodes aperture from the symmetry axis of the source by a certain offset, which is a defining parameter of this design. The steering effect of the electric potential will be due to the effect introduced by shifts as described in Munro E., op.cit.

Sheared electrodes are electrodes with a tilted aperture, i.e. the apertures axis (ax) is not parallel to the body axis (bx), but they enclose an angle. The tilt is to deviate the electrodes aperture from the symmetry axis of the body by a certain expense, which is a defining parameter of this design. The steering effect of the electric potential will be due to the effect introduced by tilts as described in Munro E., op.cit.

Ramped electrodes are electrodes with varying thickness, i.e. the thickness of the electrode is not homogenous. The ramp deviates the electrodes body away from a symmetric design with respect to the body axis. The step-size in the thickness of the body will then be maximal in between diametric points with respect to the axis, which is a defining parameter of this design. The ramp height, i.e. the step-size, can be constant or a continuous function of the polar angle. The steering effect of the electric potential will be due to the effect introduced by tilts and shifts as described in Munro E., op.cit.

Tilted electrodes are electrodes with a tilted body, i.e. the electrodes body axis (bx) is not parallel to the central axis (cx), but they enclose an angle. The tilt is to deviate the electrodes body from the symmetry axis of the body by a certain expense, which is a defining parameter of this design. The steering effect of the electric potential will be due to the effect introduced by tilts as described in Munro E., op.cit.

Elliptical electrodes are electrodes with an elliptical aperture, i.e. the shape of the aperture of the electrode is intentionally non-rotationally symmetric, with respect to the aperture axis (ax). The ellipticity of the shape is to deviate the electrodes aperture from a symmetry with respect to the local axis (ax). The ellipse is defined by the ratio of the lengths of the two orthogonal, main axes of the ellipse, which is a defining parameter of this design. The steering effect of the electric potential will be due to the effect introduced by ellipticity as described in Munro E., op.cit.

The above types of steering electrodes enable improved controlling the trajectory of the charged particles. Combinations of designs, also with prior arts symmetric components, into a charged particle source are feasible and modular. Perturbations introduced by an steering electrodes can be modeled using finite difference programs for computing tolerances for electrostatic lenses, in regimes as described in Munro E., op.cit.

Thus, by virtue of the invention there is a larger degree of freedom concerning the parameters of design of a charged particle source, enabling to adjust the trajectories of charged particles beams, i.e. likewise the primary and secondary beam, to achieve a desired result, i.e. directing them towards the target and a defined element serving as "dump location" associated with the source space, i.e. where the secondary counter beam charged particles can be absorbed or otherwise disposed of while not degrading the source.

Furthermore, in many advantageous embodiments of this invention the design of the emitter system may still provide rotationally symmetric distribution of the properties of the charged particle beam, which are basically a radial function of the distance from the central axis cx of the apparatus. It is generally desired that the primary charged particles provide a homogeneous current density with the illumination beam ib illuminating the pattern definition device 4. The number of steering electrodes used in a charged particle source can vary. Of course, any further electrodes may be present in addition to the above-mentioned electrodes, e.g. the suppressor, lens and counter electrodes, in the source to achieve further advantages.

In order to further improve processes and enable a better control of the locations the counter beam is projected to, it may be advantageous to realize some of the electrodes as "split electrodes". Split electrodes are composed of a number of "sectorial electrodes", at least two, for example four or eight sectorial electrodes. Sectorial electrodes are configured to be applied an electrostatic potential (which can be different from the other sectorial electrodes of the same split electrode), and their body may be a portion of the body of an electrode. And the bodies of all sectorial electrodes combined in one split electrode are forming an electrode with small gaps between each neighboring sectorial electrodes. The neighboring sectorial electrodes may be different in potential and design.

In addition, these split electrodes may be used during another operational mode, a cleaning mode, for directing ionized particles to specific regions on the emission surface. This cleaning mode may be used to sputter the surface, reduce bigger contaminations and refurbish the surface. Also the electrodes may be configured to tune the intensity of ionized particles impinging on the emission surface by means of varying the electrostatic potentials. This can be used for an improvement of the cleaning mode as escribed in the applicants document EP 3 518 268 (=US 2019/0237288), which may obtain higher homogeneity of beam parameters, for example current density, angular distortions and numerical aperture. One may also vary the voltages of the electrodes—including steering electrodes and furthermore also split electrodes—involved in any operational mode of the source over time. This may be done in a step-wise manner, wherein for at each step the applied voltage to the electrodes is maintained for a certain duration. The voltage levels and pertinent durations are chosen suitably to achieve a desired profile of cleaning action.

A charged particle source according to the invention can be used in a charged particle multi-beam apparatus configured for processing or inspection of a target, by means of exposure with a beam of electrically charged particles. Preferably, such a charged-particle multi-beam apparatus may comprise an illumination system, a pattern definition device and a projection optics system, in addition to the charged particle source according to the invention.

Examples of suitable dimensions of electrodes are
- an aperture radius of an electrode may be within a range from 0.5 mm up to 1.0 mm,
- a physical dimension of an electrode along a beam-direction is chosen within a range from 0.5 mm to 3 mm,
- a physical space between neighboring electrodes is chosen from a value between 1 mm up to 2 mm;

these dimensions may be identical for all electrodes or varying for each individual electrode. The dimension of a source space, i.e. the distance from the emission surface to the aperture in the counter electrode, may be, e.g., in a range from 4 mm to 37 mm.

The electrodes are preferentially composed of a conductive material such as titanium, molybdenum or 316L stainless steel. The dimension of interstices 705 (FIG. 7b) in split electrodes are chosen suitable, e.g., in a range from 0.1 mm to 0.5 mm; these interstices may be realized as gaps ("empty space", i.e., vacuum) or may be realized filled with dielectric spacers, such as machined MACOR, Al2O3 or other ceramics.

Examples of suitable design parameters of steering electrodes are as follows:
- a displacement, i.e. the offset of the electrode's body axis bx from the central axis cx, of a displacement electrode (FIG. 9), may be within a range from 0.005 mm to 0.100 mm,
- a shear angle, i.e. the angle enclosed within the electrode's aperture axis ax and the body axis bx, of a sheared electrode (FIG. 10), may be within a range from 5.0 mrad to 50.0 mrad,
- the ramp height, i.e. the thickness of opposite points, with respect to the aperture axis ax, of a ramped electrode (FIG. 11), may be within a range from 0.500 mm to 2.500 mm,
- the tilt angle, i.e. the angle enclosed within the electrode's body axis bx and the central axis cx, of a tilted electrode (FIG. 12), may be within a range of 5.0 mrad to 40.0 mrad,
- the ellipticity, i.e. the ratio of the semi-diameters of a non-circular ellipse (or more general ovoid shape), of an elliptical electrode (FIG. 13), may be above 101%, The physical dimensions of the electrodes are chosen with regard to the effective path length of the beam e through the electrode, which typically is a range from 0.5 mm to 3 mm. Minimal necessary spaces between neighboring electrodes are designed due to the assigned electric potentials and the dielectric materials in-between them, e.g. these are defined by a vacuum breakthrough voltage. Also the shape and face design of the electrodes is made according to the above-mentioned considerations. The basic concepts for manufacturing and realizing a specific design are known to the skilled person and generally understood and not explained in detail. Typical metal manufacturing is well established and finishing the contours and faces of the electrodes is viable, e.g. via CNC-machining or laser-processing. Also, it will be evident to the skilled person that the voltage configurations of a charged particle source and its electrodes may be varied to achieve further suitable configurations of additional operational modes. The design parameters are not always shown to scale in the figures. Details are visually exaggerated for better clarity of the drawings.

Figure 2:
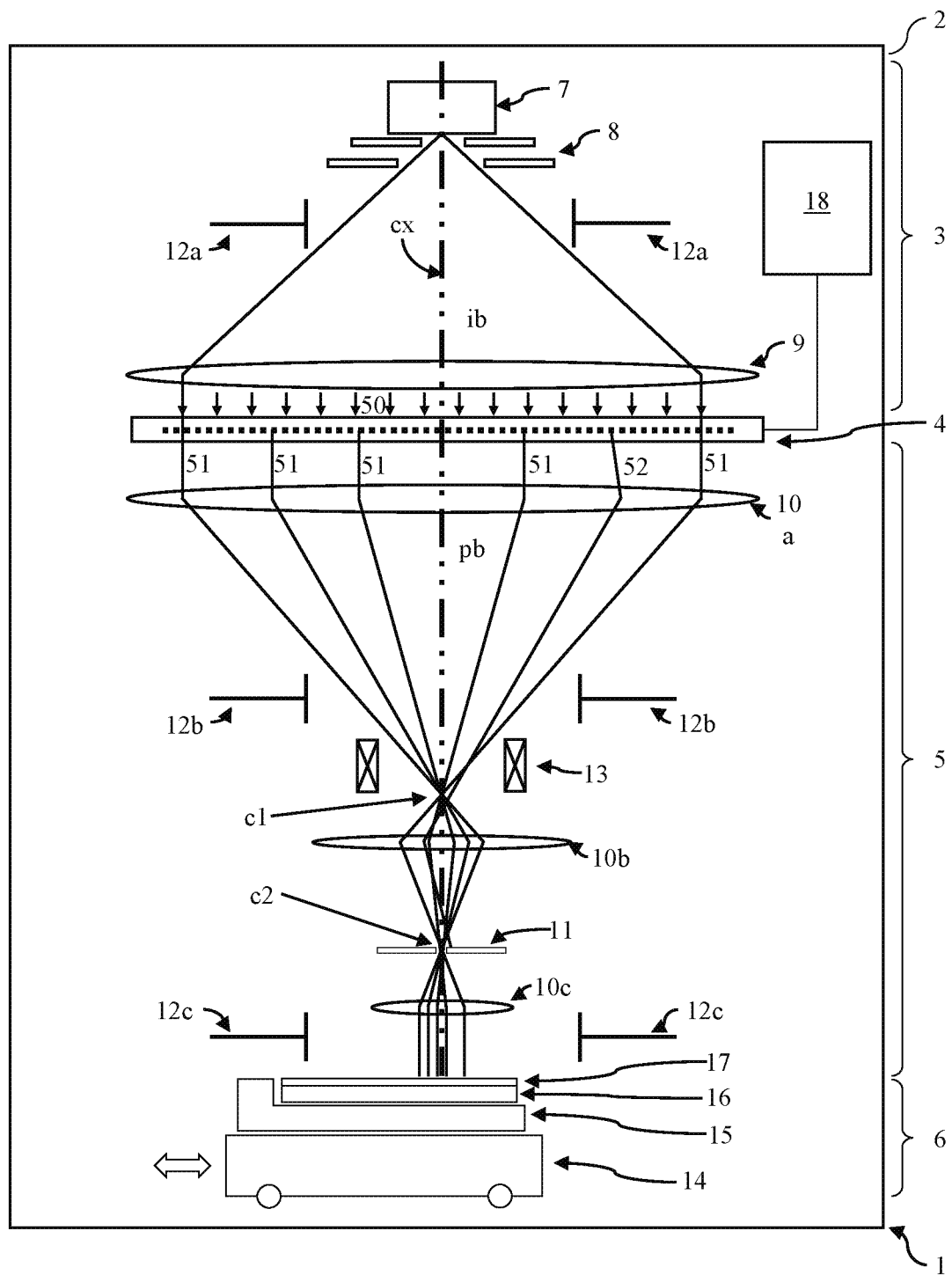
FIG. 2 shows a lithographic system of state of the art in a longitudinal sectional view in which the source of FIG. 1 can be suitably incorporated.

FIG. 1 shows a schematic representation of a charged particle source 100, according to one embodiment of the invention in a longitudinal section along a central axis cx of the apparatus 1 (FIG. 2). The charged particle source 100 comprises a emitter electrode 101 having an emission surface 111 which is configured for the emission of charged particles along a designed direction of emission of a charged particle beam e. A suppressor electrode 102, i.e. a Wehnelt cylinder, and an counter electrode 103 with an aperture 113 at the location downstream, where the charged particle beam e passes through said electrode. Suitable layouts of the emitter electrode 101, suppressor 102 and counter electrode with an aperture 103 are well-known to the skilled person. The source is located in a housing 120, which enables the source to be connected to the housing 2 of the apparatus 1 (FIG. 2), and which is connected to a vacuum pumping system 121 of its own, and/or is held at vacuum through the vacuum system of the apparatus 1. A source space 110 represents the active volume of the source, shown as a presumed hull of the charged particle beam e, which is not representing the path of flight of any charged particle in particular, but denotes a region of interest in the design of the source and its electrodes. A region of interaction i is a presumed subspace of the source space, which is exemplary for a vicinity of the primary charged particles e, where particles are interacting with residual matter and secondary counter charged particles sc may emerge. For example secondary particles can also come from surfaces or ions emerging at spikes of electrodes, e.g. regions of high electric fields. For clarity and simplicity we discuss only oppositely charged secondary particles, with respect to the primary charged particle beam e. Through the design of the source and local electric fields secondary charged particles can also form a beam sc. In the figures the beam sc represents an exemplary path of secondary particles, and is also simplified for better clarity of the drawings. The electron source 100 is provided with several adjustment electrodes, which form the electrode stack of a lens. Examples of steering electrodes, i.e. non-rotationally symmetric designed electrodes, are shown as 104, 105, 106, 107, which are exemplary for one embodiment of the invention. The order of the electrodes 104, 105, 106 and 107 may be permutated, also the positions and electric potentials might be adapted. Any electrodes and/or subset of electrodes of the source 100 can electrically be connected to a voltage supply unit 157 which provides electrostatic potentials. If needed it will provide them individually for individual electrodes and/or group wise sorted to subsets of electrodes. For the sake of clarity of the drawings the electric connecting lines from the voltage supply unit 157 to the plurality of electrodes in the source 100 are not shown as they are generally understood.

The composite design of the charged particle source 100 shown in FIG. 1 may be seen as exemplary and emphasizing the multitude of embodiments and designs included in embodiments of the invention. In order to modify and/or control the trajectories of the different types of charged particles, some of the electrodes 104 to 107 might be realized as split electrodes 700 (FIG. 7). Split-electrodes are composed of two or more sectorial electrodes separated by dielectric gaps. A charged particle source 100 comprising a number of (in particular, at least three) adjustable electrodes 104, 105, and 106 can comprise an einzel lens. The adjustment electrodes are, for instance, realized as conductive plates with apertures, and separated by dielectric gaps, all of which are of abovementioned dimensions.

FIG. 2 shows a schematic view of a typical multi-beam writer and its main components 2 as described above in the field of the invention and description of prior art.

Figure 3:
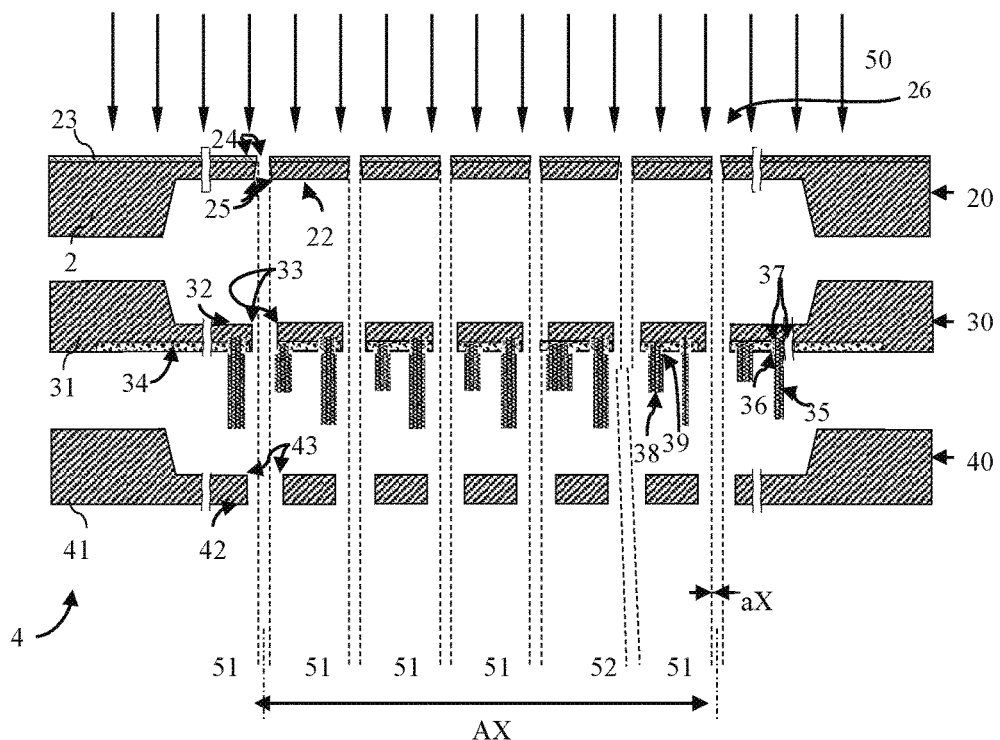
FIG. 3 shows a pattern definition system of state of the art in a longitudinal section.

FIG. 3 shows a schematic view of a pattern defining aperture system and its main components 4 as described above in the field of the invention and description of prior art.

Figure 4:
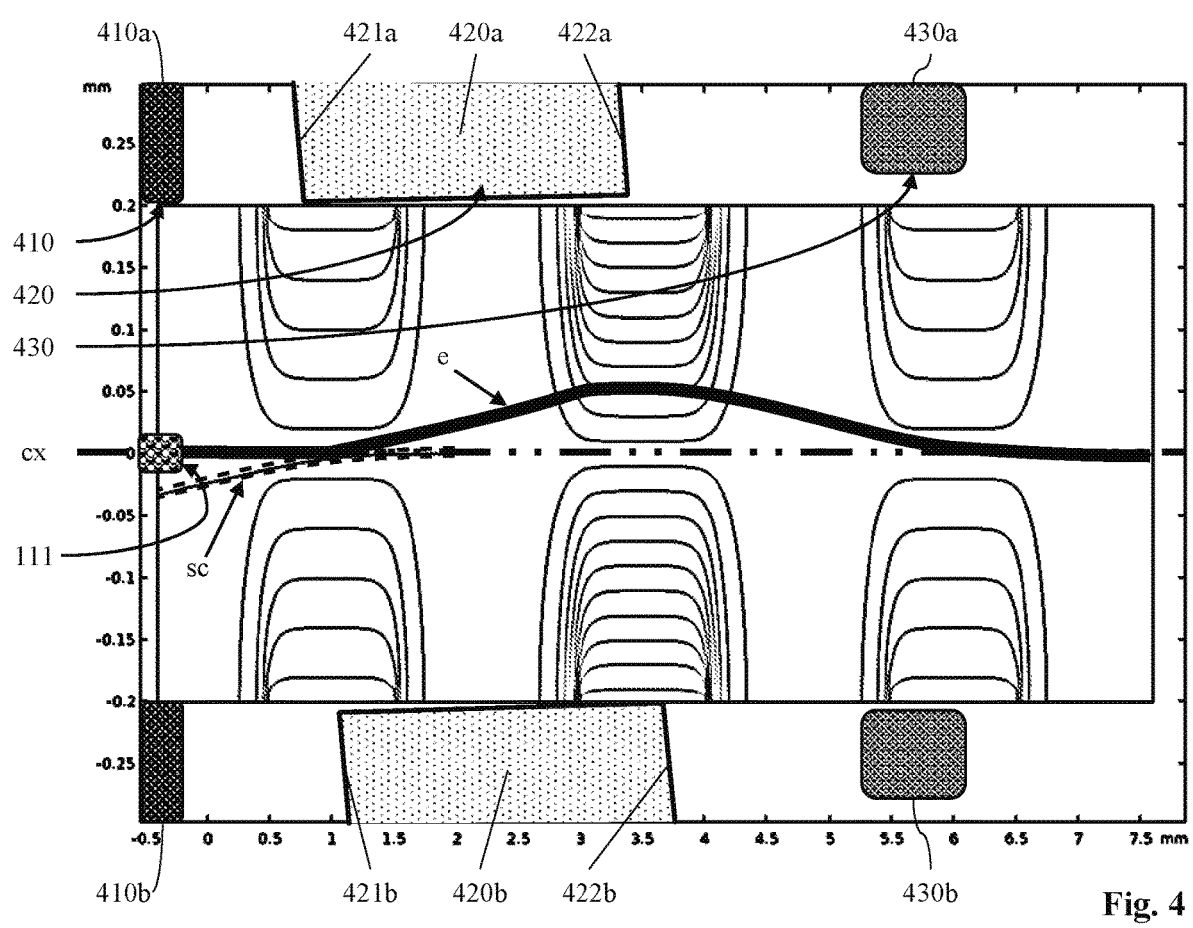
FIG. 4 illustrates the difference in the spatial distribution of electric potential as caused by a steering electrode arrangement in a charged particle source of the type shown in FIG. 1 with a tilted and a shifted electrode, where the central axis is shown horizontal; exemplary paths of both primary and secondary particles are shown.

FIG. 4 illustrates the difference potential within a particle source, i.e. a plot of the equipotential lines of the difference potential $\Delta\Phi$, which is the difference between the electric potential of the non-perturbed configuration (radially symmetric case) and the electric potential of the configuration with steering electrodes displaced/tilted as indicated in the drawing. The data illustrated in FIG. 4 are presented for a longitudinal section along the axis cx (shown horizontal) and have been obtained from a simulation of the electric potential difference between steering electrodes and rotational symmetric electrodes. In particular, these are a suppressor electrode 410, a tilted electrode 420 and a shifted electrode 430, which have "straight" electrodes (i.e., neither coned nor sheared apertures). The scales of the axes is also given in mm, corresponding to an example of the physical dimensions with respect to the normal of the emission surface 111. The vertical axis corresponds to radial direction of the charged particles source global polar coordinate system. It is to be appreciated that all scales given are exemplary and need not be exact measures. Also the positions, shapes and sizes of electrodes are given as illustrative examples only and are not restrictive to the invention.

The difference potential is given by $\Delta\Phi=\Phi_0-\Phi_c$, where $\Phi_0$ represents the potential of a rotational symmetric source, while $\Phi_c$ represents the potential of an non-rotational symmetric source, i.e. employing steering electrodes. Furthermore effects of this design on both primary charged particle beam e and secondary charged particle beam sc are illustrated; which is representing the overall central axis of the apparatus 1. All electrode parts which are shown in the top-half of the illustration are denoted by an index a, while all bottom-half parts are denoted with an index b. Terms "top" and "bottom" with respect to this figure do not represent physical positions but only positions in the figure, e.g. they do not represent upwards or downwards position in the apparatus. For this simulation a suppressor electrode 410, a ring electrode of which two section portions 410*a* and 410*b* are visible in FIG. 4, is rotationally symmetric with respect to the axis cx.

One electrode 420 (visible in FIG. 4 are section portions 420*a* and 420*b*) is a tilted electrode, where the body is rotated around a pivotal center on the axis cx. The pivotal axis is perpendicular to the plane of depiction. A tilt, i.e. a small rotation in counter-clockwise direction in FIG. 4, is performed in such a way that the upper face 421*a* of portion 420*a* is rotated towards the suppressor electrode; in contrast, the face 421*b* is rotated away from the suppressor electrodes. Likewise also faces 422*a* and 422*b* are tilted. Thus the distance between portions 410*a* and 420*a* has become smaller, while the distance between portions 410*b* and 420*b* has become wider, with increased radial distance from the axis cx.

Another electrode 430 (visible in FIG. 4 are section portions 430*a* and 430*b*) is a displacement electrode, where the aperture is shifted from the central axis cx. The aperture is displaced upwards in the drawing, so the upper portion 430*a* is shifted away from the axis cx, while the lower portion 430*b* is moved closer. Thus the axis of the electrode (located in the center between portions 430*a* and 430*b*) and the axis cx do not coincide any more.

FIG. 4 also shows a path of the charged particle beam e emerging from the emission surface 111. Also an exemplary path of secondary charged particles is shown, for secondary particles emerging in the center point of electrode 420. Downstream, the beam e is distorted from the central axis cx by the difference potential introduced by the tilt of electrode 420, which also bends the oncoming beam of secondary charged particles sc in a direction away from the emission surface 111. This effect is highly encouraged by an embodiment of the invention, i.e. to protect the emission surface 111 from any above-mentioned damages, e.g. contaminations, sputtering or other negative effects of the beam of secondary charged particles.

In order to counteract the deviation of the beam e of primary charged particles from the central axis cx, the electrode 430 shifted, in the depiction of FIG. 4 upwards, so as to introduce a further difference potential which effects another deflection of the beam e, in FIG. 4 downwards. Thus, the primary charged particle beam e is redirected onto the axis cx, and can, in consequence, recover a generally rotational symmetric beam profile. In other words, the beam may have distortions and densities which are rotational symmetric at the final aperture 113 (FIG. 1) of the source (not shown in FIG. 4). In contrast, the secondary particles sc are directed to a lateral direction of the particle source, and preferably they are absorbed at a surface serving as a "dump location". Referring to FIG. 1, such a surface serving as dump location dp for secondary particles may be located in one the components of the particle source.

Figure 5A:
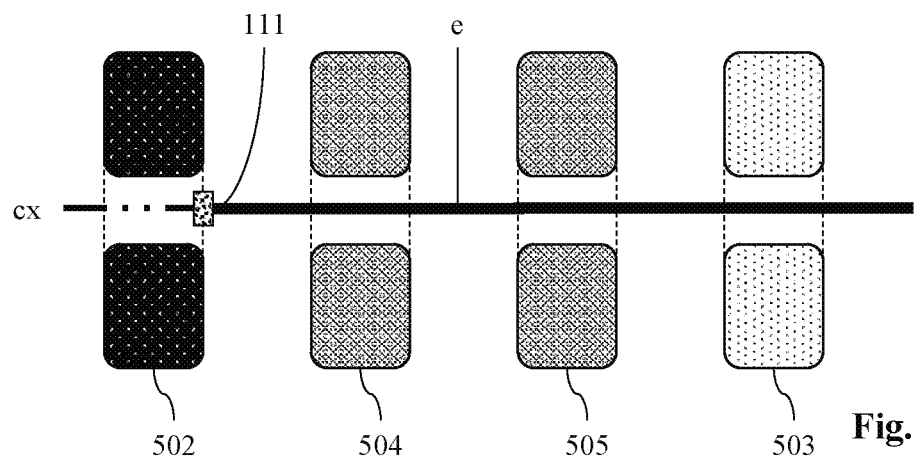
FIGS. 5a, 5b and 5c illustrate the effect of steering electrodes on the mean path of primary charged particles in an exemplary particle source during operation (emission mode), where
Figure 5B:
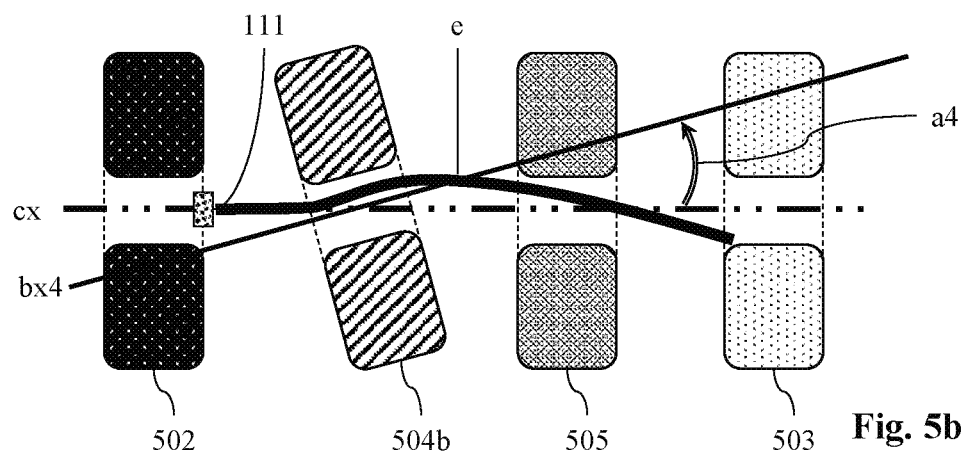
Figure 5C:
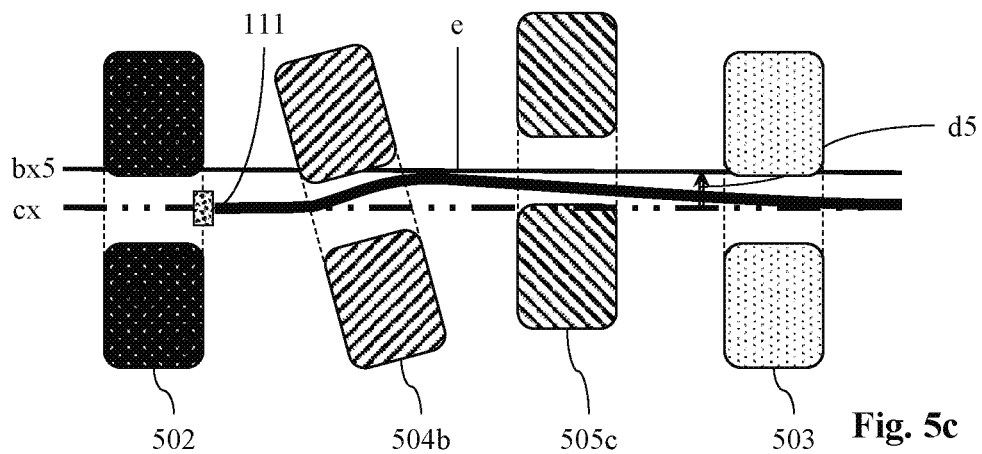
Figure 6A:
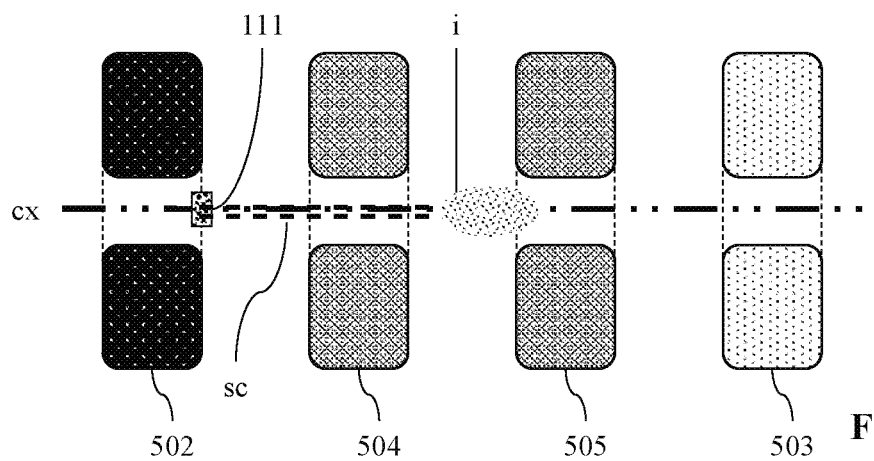
FIGS. 6a, 6b and 6c illustrate the effect of steering electrodes on the mean path of secondary charged particles in the exemplary particle source of FIGS. 5a-5c, where
Figure 6B:
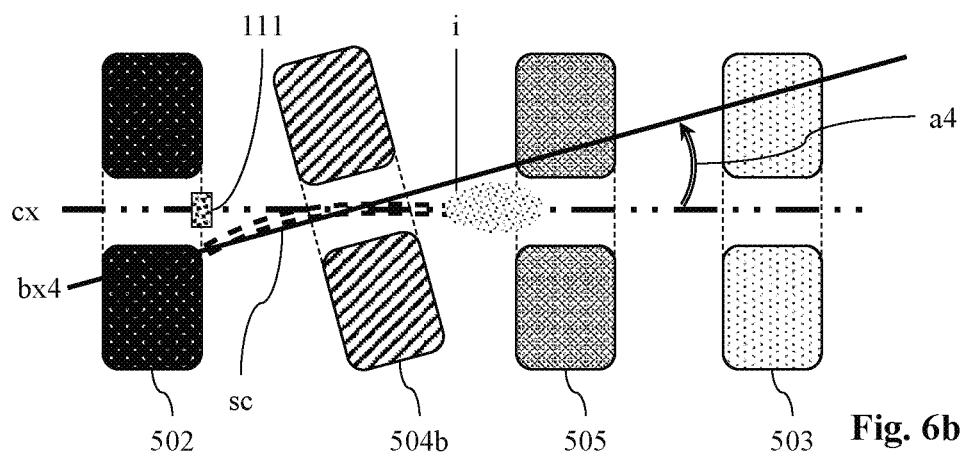
Figure 6C:
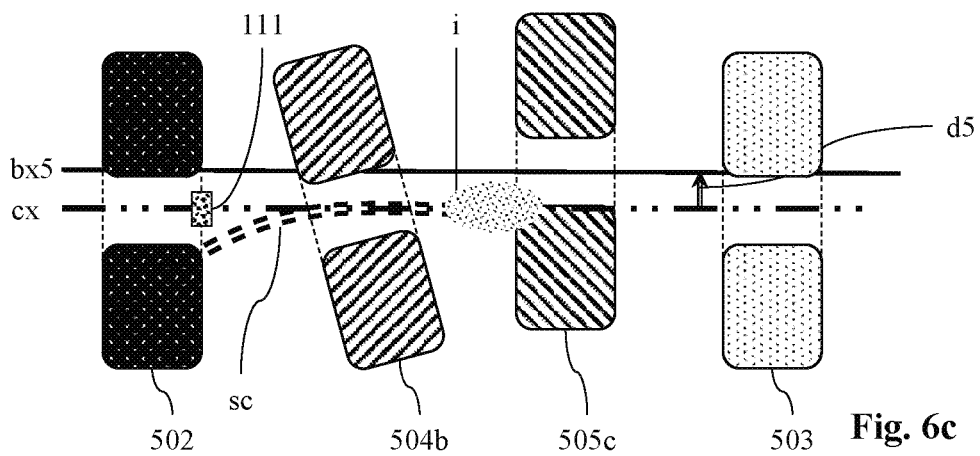

FIGS. 5*a*, 5*b* and 5*c* and FIGS. 6*a*, 6*b* and 6*c* illustrate the concept of the invention to replace a rotationally symmetric design as in prior art towards obtaining a non-rotationally symmetric design. This may also be done in an iterative development. For better clarity, effects on the primary charged particle beam e and secondary charged particle beam sc are split into separate figures. Figures FIGS. 5*a* to 5*c* show the effects on the primary charged particle beam e only, while FIGS. 6*a* to 6*c* show the effects on the secondary charged particle beam sc only. In the following section of this paragraph the index a refers to both FIGS. 5*a* and 6*a*; and likewise for indices b and c in relation to FIGS. 5*b* and 6*b*, and 5*c* and 6*c*, respectively. For better clarity of the picture, only some parts of the assembly are shown, i.e. electrodes 502, 503, 504 and 505, the central axis cx of the apparatus 1 (FIG. 2) and the emission surface 111. It is emphasized that the dimensions of defining parameter of "steering", such as displacements and tilting angles, largely exaggerated in the drawings.

Starting with the situation of prior art, illustrated in FIG. 5*a*, the electrodes 502 to 505 are in a rotationally symmetric position with respect to the axis cx, and of rotational symmetric design. Emitted charged particles form the primary charged particle beam e coming from the emission surface 111. Secondary particles may arise at any location of the primary beam, but shown in FIG. 6*a* are only secondary charged particles which emerge from an exemplary region of interaction i. Charged particles with electric charge of similar sign as the primary beam are attracted by the counter electrode 504 and will travel downstream along the axis cx; in contrast, secondary charged particles of opposite charge, e.g. positively charged ions in case of an electron emitter in an eMET, will travel towards the emission surface 111. In this initial situation the secondary charged particles sc propagate towards the emission surface, an "area to be protected", on which they can cause severe damage. Thus in the next step of layout, illustrated in FIG. 5*b*, a variation of the electrode location and/or orientation is introduced, thus "steering" the potentials off the axis of rotational symmetry (i.e., adding a small deviation from rotational symmetry). For instance, electrode 504 is tilted around a pivotal centre-point on the axis cx, by a certain angle a4. It now becomes steering electrode 504*b*. The defining parameter for this steering electrode is the angle a4, which is defined between the body axis bx2 (describing the center of the electrode body) and the central axis cx of the particle source. This tilting of the electrode introduces a steering of the electric potential, and consequently the primary charged particle beam e will deflected, in the drawings upwards to the direction of the tilting, assuming that a suitable potential is applied to electrode 504*b*. Then, with reference to FIG. 6*b*, the secondary counter-charged particles beam sc of an opposite charge will be deflected in a direction away from the "area to be protected", i.e. downwards from the emitter surface 111. In a next stage, the effect on the primary charged particle beam e is compensated. This is, for instance, achieved by shifting electrode 505 in a direction upwards in FIGS. 5*c* and 6*c*, towards a position of shifted electrode 505*c*. The defining parameter for this steering electrode is the displacement d5, which is defined as the offset between the body axis bx5 of the electrode and the axis cx of the apparatus. Through the shift of the electrode a further steering of the electric potential is introduced. Thus, by applying a suitable potential to electrode 505*c*, the primary charged particle beam e will be deflected again, this time downwards, and back onto the axis cx, and therefore finally in the direction of the charged particle source's final aperture 113 (FIG. 1), which preferably is along the central axis cx.

FIGS. 7*a* and 7*b* illustrate one exemplary embodiment of a split electrode 700 for a steering electrode, in particular a displacement electrode (FIG. 9). It is divided into four sectorial electrodes 701, 702, 703 and 704. Sectorial electrodes of one split electrode are being located at different polar angles, i.e. rotated around the central axis cx, connected by isolating gap spacers 705, e.g. made of a suitable dielectric materials. A voltage supply unit 157 is a high voltage source, that can supply different electric potentials for various sectorial electrodes 701 to 704 of a split electrode. Sectorial electrodes are connected to the voltage supply so they can be electrically biased with individual electrostatic potentials; where appropriate they may be biased in couples or to a common electrical potential. Thus, the split electrodes allow the implementation of an additional "multipole" mode, in addition to a "monopole" mode. A monopole mode is defined as a mode in which all the sectorial electrodes of a split electrode share the same electrical potential; whereas a multipole mode is defined as a mode in which the sectorial electrodes will generally be applied different electrical potentials.

The number of plates that compose a split electrode may vary as appropriate with regard to the requirements imposed. Typical and feasible numbers of sectorial electrodes are for example even numbers, for instance from two to twelve.

Figure 8A:
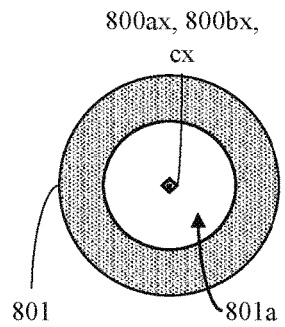
FIGS. 8a, 8b and 8c show a state-of-the-art rotational symmetric electrode, in a top view (FIG. 8a), a longitudinal section (FIG. 8b), and a perspective view (FIG. 8c)
Figure 8B:
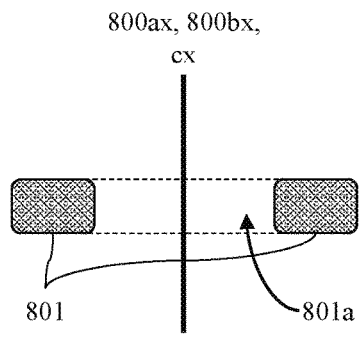
Figure 8C:
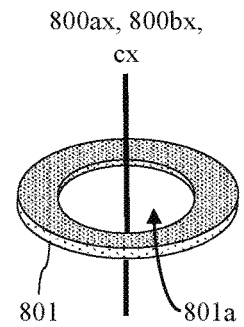

FIGS. 8*a*, 8*b* and 8*c* show a prior-art rotational symmetric electrode for use in a charged particle source in a top view (FIG. 8*a*), a longitudinal section (FIG. 8*b*) along the central axis, and a perspective view (FIG. 8*c*). Electrodes like this are used in a charged particle source of a typical multi-beam writer as described above in the field of the invention and description of prior art. In accordance with conventional layout, the electrode 801 is rotational symmetric with respect to the central axis cx. The pertinent details concerning manufacturing and design are known to the skilled person and generally understood.

It is remarked that in a realistic implementation the electrodes 104 to 107, including the emitter electrode 101, the counter electrode 103 and the suppressor electrode 102, which in general can give electrical potentials of a rotational symmetry with respect to the central axis cx, may be realized in a more complex shape as shown here, depending on the details of implementation. Furthermore, also these electrodes 104-107 may be steering electrodes.

The following figures will present various examples of different steering electrodes within the framework of the present invention. In each of these figures the central axis is indicated as cx, a respective body axis is indicated as bx, and an aperture axis is indicated as ax. The central axis cx as shown in the drawings represents a generalized rotational symmetry axis of a charged-particle beam apparatus, such as a multi-beam writing tool, to allow for a reference for an alignment of several electrodes in a stack of electrodes. FIGS. 8*a* to 13*c* are arranged in triplets of drawings, where the left-hand drawing (8*a* to 13*a*) shows a top view, the middle drawing (8*b* to 13*b*) shows a longitudinal section, and the right-hand drawing (8*c* to 13*c*) shows a perspective view, respectively. Dimensions and scales in these drawings are merely illustrative examples to elucidate the principle of the respective implementation, and are not necessarily to scale or size, nor are they to be construed as restrictive for the invention. Where manufacturing processes are explained, they are exemplary and the skilled person will easily conceive of any suitable modification of machining. Sources according to the invention with employed steering electrodes can be used in a charged particle source of a multi-beam writer as described above in the field of the invention and description of prior art.

Figure 9A:
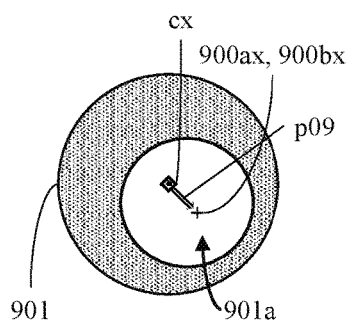
FIGS. 9a, 9b and 9c show a displacement electrode according to one embodiment of the invention, in a top view (FIG. 9a), a longitudinal section (FIG. 9b), and a perspective view (FIG. 9c)
Figure 9B:
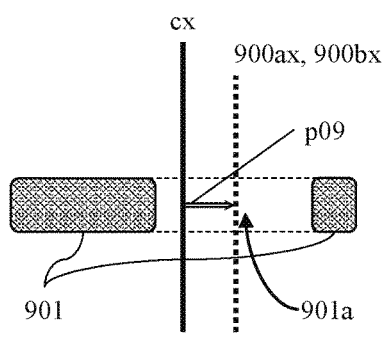
Figure 9C:
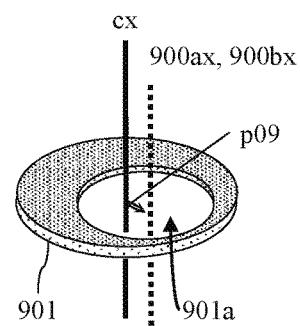

FIGS. 9a, 9b and 9c show a displacement electrode according to one embodiment of the invention for use in a charged particle source. The displacement electrode 901 is non-rotational symmetric with respect to a central axis cx and has an aperture 901a. The parameter of design is the physical distance of displacement p09, measured between the central axis cx and the body axis 900bx, which aligns with the aperture axis 900ax.

Figure 10A:
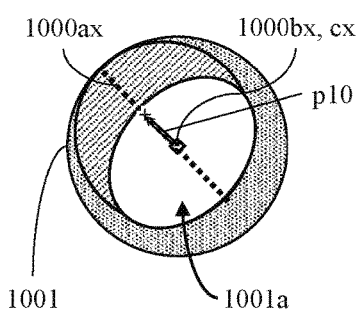
FIGS. 10a, 10b and 10c show a sheared electrode according to one embodiment of the invention, in a top view (FIG. 10a), a longitudinal section (FIG. 10b), and a perspective view (FIG. 10c)
Figure 10B:
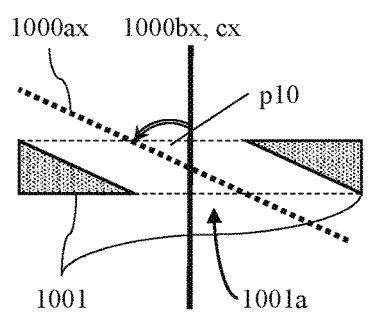
Figure 10C:
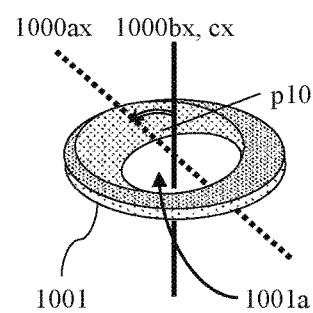

FIGS. 10a, 10b and 10c show a sheared electrode according to one embodiment of the invention for use in a charged particle source. The sheared electrode 1001 is non-rotational symmetric with respect to a central axis cx and has an aperture 1001a. The parameter of design is the shear angle p10, measured between the central axis cx, which aligns with the body axis 1000bx, and the aperture axis 1000ax.

FIGS. 11a, 11b and 11c show a ramped electrode according to one embodiment of the invention for use in a charged particle source. The ramped electrode 1101 is non-rotational symmetric with respect to a central axis cx and has an aperture 1101a. The parameter of design is the ramp height p11, measured as the maximal difference of thickness of the electrodes at opposite points of the electrodes aperture, with respect to the central axis cx, which aligns with the body axis 1100bx and the aperture axis 1100ax. In other words, the thickness of the electrode may vary between a minimum value and a maximum value at positions opposite to each other with respect to the central axis cx; the variation along a connecting line of the locations of minimum and maximum thickness may be linear (as visible in FIG. 11b), stepwise linear or a general strictly increasing function.

FIGS. 12a, 12b and 12c show a tilted electrode according to one embodiment of the invention for use in a charged particle source. The tilted electrode 1201 is non-rotational symmetric with respect to a central axis cx and has an aperture 1201a. The parameter of design is the tilt angle p12, measured between the central axis cx and the body axis 1200bx, which aligns with the aperture axis 1200ax.

FIGS. 13a, 13b and 13c show an elliptical electrode according to one embodiment of the invention for use in a charged particle source. The elliptical electrode 1301 is non-rotational symmetric with respect to a central axis cx and has an aperture 1301a. The parameter of design is the ratio of the lengths of the two orthogonal, main axes of the ellipse, p13a and p13b, measured between opposite points of the electrodes aperture, with respect to the central axis cx, which aligns with the body axis 1300bx and the aperture axis 1300ax.

It will be appreciated that the electrodes discussed here, which are realized as ring electrodes, may generally have a cylinder ring or polygonal ring shape, or any other shape that will be suitable for a specific layout. The cylinder ring shape in the above-discussed drawings is only exemplary.

Figure 14:
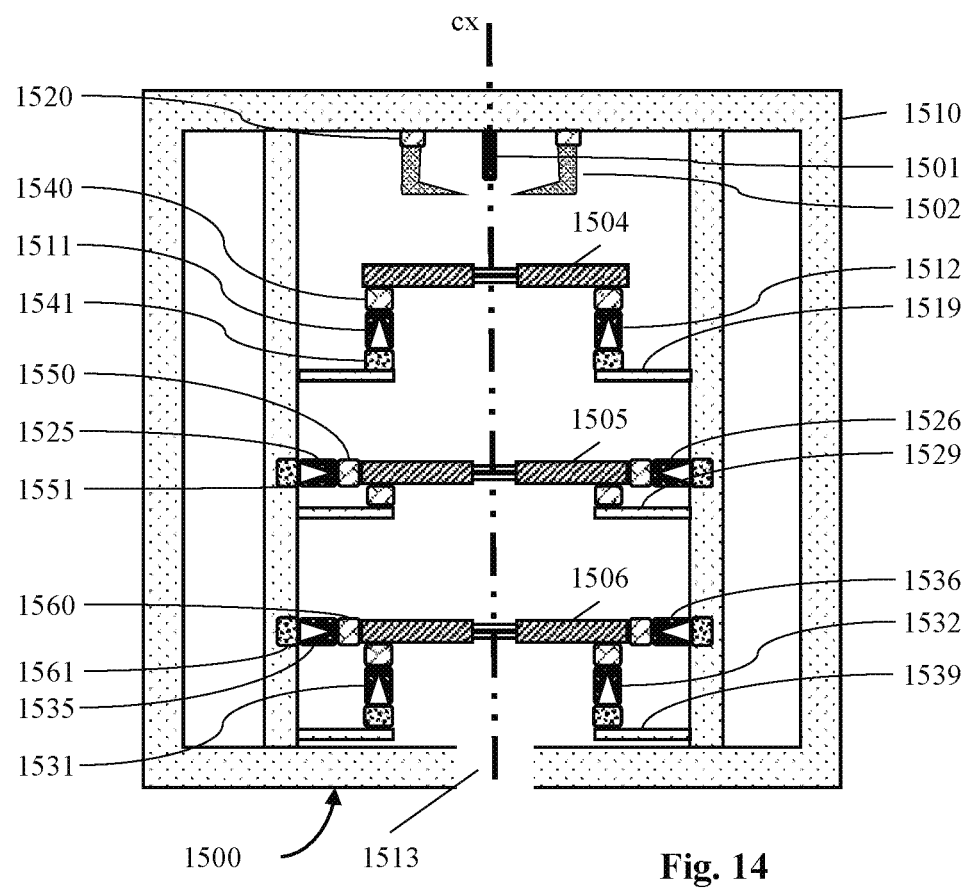
FIG. 14 illustrates a charged particle source according to one embodiment of the invention in a longitudinal sectional view, including adjustable mounting devices for the electrodes.

FIG. 14 shows a schematic view of a charged particle source 1500 according to another embodiment of the invention, in a longitudinal section along a central axis cx. The assembly shown is designed for use in an apparatus of the kind as shown in FIG. 2. The assembly comprises a housing 1510, which also provides a mounting interface of the source, and further the emitter electrode 1501 and a suppressor electrode 1502; the electrodes are electrically separated from the housing by means of insulators 1520. An aperture 1513 (corresponding to aperture 113 of FIG. 1) is located downstream the direction of emission, which is vertical downwards in FIG. 14. If made from a conductive material in the vicinity of the aperture 1513, the mounting interface can act as a counter electrode (cf. electrode 103 of FIG. 1). Electrodes 1504, 1505 and 1506 are connected to the mounting interface 1510 and/or neighboring electrodes through insulators, i.e. components 1540, 1550 and 1560. Each electrode can be assigned a different electric potential with respect to the housing. Electrodes 1504, 1505 and 1506 form an electrode stack. Further important components, which are not shown in the drawing, are a power supply unit, i.e. a potential generator for any electrode of the source (cf. 157 of FIG. 1) and a pressure control system to employ a stable vacuum in the source (cf. 121 of FIG. 1).

Electrodes 1504, 1505 and 1506, are mounted on supports 1519, 1529 and 1539 respectively. The electrodes are placed on insulators 1540, 1550 and 1560, which in turn are mounted on piezo-electric actuators 1511, 1512, 1525, 1526, 1531, 1532, 1535 and 1536. Each of them is connected to control units 1541, 1551, 1561. The physical variables, i.e. lengths, heights or widths, of the connected actuators are controlled via voltages applied to the respective control units. The design allows the usage of steering electrodes in the positions of 1504, 1505 or 1506, the piezo-electric actuators allow for in-situ tilting and in-situ shifting of said electrodes, i.e. shifting and tilting without disassembly.

Actuators 1511 and 1512 can be employed to tilt electrode 1504 in-situ, slightly extending one actuator and/or shrinking the other via the piezo-electric effect along an axis parallel to the central axis cx. The physical height of the actuators is controllable by the applied voltage to the control unit 1541.

Actuators 1525 and 1526 can be employed to shift electrode 1505 in-situ, by slightly extending one actuator and/or shrinking the other via the piezo-electric effect along an axis perpendicular to the central axis cx. The physical width of the actuators is controllable by the applied voltage to the control unit 1551.

Actuators 1535 and 1536 can be employed to shift electrode 1506 in-situ, by slightly extending one actuator and/or shrinking the other via the piezo-electric effect along an axis perpendicular to the central axis cx. The physical width of the actuators is controllable by the applied voltage to the control unit 1561. Also actuators 1531 and 1532 can be employed to effect an in-situ tilting of electrode 1506, by slightly extending one actuator and/or shrinking the other via the piezo-electric effect along an axis parallel to the central axis cx.

Figure 15:
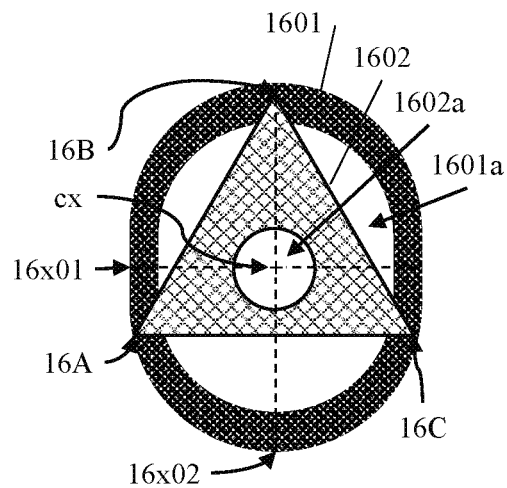
FIGS. 15 and 16 are top view depictions of two realizations of an eccentric mounting device for mounting and positioning of a triangle-shaped steering electrode.
Figure 16:
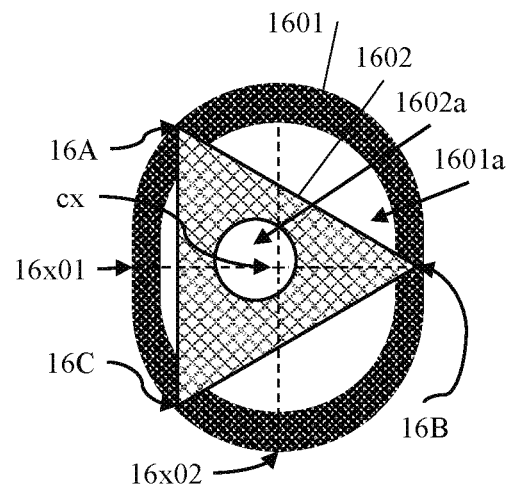

FIGS. 15 and 16 show top views of two variants of an embodiment of a device 1601 for eccentric mounting and positioning of a steering electrode, which is, e.g., realized as a "triangular electrode" 1602, i.e. and electrode held in a mounting frame offering three attachment points arranged in a triangle, preferably isosceles or equilateral triangle. This variant offers a significant simplification and improvement of the layout of electrodes. The mounting device comprises an aperture 1601a, which is wide enough to allow accommodating an electrode 1602 which is provided with a aperture 1602a at a center thereof. The aperture 1602a may have any suitable shape, such as circular, elliptic, or polygonal. In other words, the body of the mounting device 1601 shall not obstruct any part of the aperture 1602a of the electrode 1602. The triangular outer shape of the electrode has three connection points 16A, 16B and 16C, which correspond to the corners of the triangle. The central axis cx is shown at the axes section point in FIGS. 15 and 16; it may coincide with the center of the aperture 1602a as shown in FIG. 15, which may be referred to as a default position. In FIG. 16 a displacement electrode is created, for instance through a rotation of the electrode 1602 by an angle around the axis cx, which also results in that the center of the aperture 1602a is displaced from said axis cx by a small distance.

Of course, other positions in addition to the examples of FIGS. 15 and 16 may be realized. It thus allows for a multitude of different displacement electrodes being made from the same components. The mounting device illustrated in FIGS. 15 and 16 is not restricted to displacement electrodes, but is also suitable for mounting and adjusting other types of steering electrodes. Eccentric devices of this kind may be used to combine a multitude of possible variations with simplified manufacturing and assembly processes.

Figure 17A:
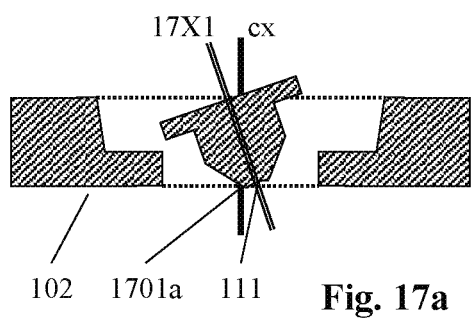
FIGS. 17a and 17b illustrates configurations of a tilted and a shifted emitter electrode, respectively (longitudinal sectional views)
Figure 17B:
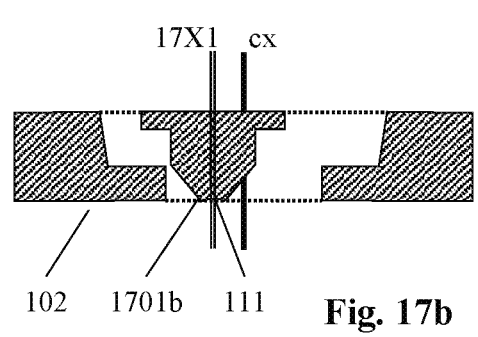

FIGS. 17a and 17b illustrate a tilted emitter electrode 1701a and a shifted emitter electrode 1701b, respectively, as further aspects of the invention, in depictions of longitudinal section along a central axis cx. The central axis cx, defining a local polar coordinate system, for example can align with a charged particles source axis of symmetry. FIGS. 17a, 17b also show the suppressor electrode 102 for better reference of the location of the electrodes 1701a, 1701b. An emitter electrode has an axis 17X1, 17X2, which for example denotes the local central axis of the emitter electrode (local polar coordinates). The emission surface 111 on the emitter electrode is also indicated. In FIG. 17a the emitter electrode 101 is modified to form a tilted emitter electrode 1701a, where the emitter electrode axis 17X1 and the central axis cx are not parallel, but enclose a certain angle. In FIG. 17b, the emitter electrode 101 is modified to form a shifted emitter electrode 1701b, where the emitter electrode axis 17X2 is parallel to the central axis cx, but offset by a certain distance. Perturbations to the rotational symmetry like these introduce steering to the electric potential of a charged particle source.

Figure 18A:
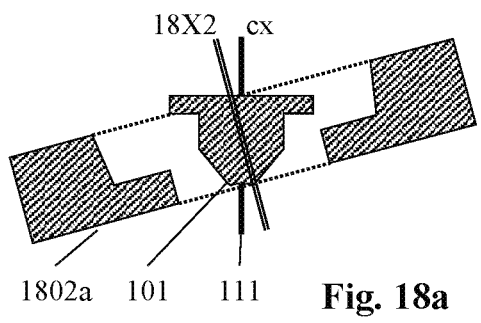
FIGS. 18a and 18b illustrates configurations of a tilted and a shifted suppressor electrode, respectively (longitudinal sectional views).
Figure 18B:
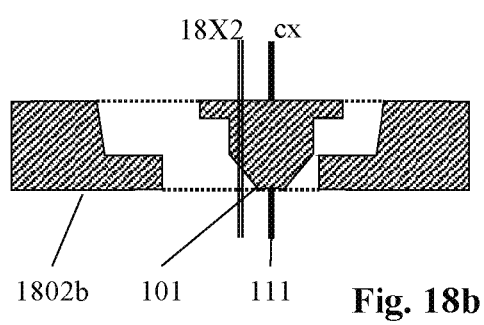

FIGS. 18a and 18b illustrate a tilted suppressor electrode 1802a and shifted suppressor electrode 1802b, respectively, as further aspects of the invention, in depictions of a longitudinal section along a central axis cx. The central axis cx, defining a local polar coordinate system, for example can align with a charged particles source axis of symmetry. FIGS. 18a, 18b also show the emitter electrode 101 for better reference of the location of the electrodes 1802a, 1802b. A suppressor electrode has an axis 18X1, 18X2, which for example denotes the local central axis suppressor electrode (local polar coordinates). The emission surface 111 is also indicated. In FIG. 18a the suppressor electrode 102 is modified to form a tilted suppressor electrode 1802a, where the suppressor electrodes axis 18X1 and the central axis cx are not parallel, but enclose a certain angle. In FIG. 18b, the suppressor electrode 102 is modified to form a shifted suppressor electrode 1802b, where the suppressor electrodes axis 18X2 is parallel to the central axis cx, but offset by a certain distance. Perturbations to the rotational symmetry like these introduce steering to the electric potential of a charged particle source.

It is to be appreciated that peripheral devices which are vital for the functionality of the source are implicitly included in the source according to the invention, such as a pressure control device, which comprises a vacuum pump for establishing a vacuum in the source space, and pertinent vacuum lines, as well as an electric potential generator, which provides electric potentials to electrodes in this invention, and suitable electric lines. Therefore each electrode is set on a controlled electrostatic voltage with respect to the counter electrode or the emitter electrode (depending on which is chosen as reference point).

The invention claimed is:

1. A charged-particle source configured for emission of electrically charged particles as a charged-particle beam along a direction of emission, said charged-particle source comprising
    a housing connectable to a vacuum system, allowing the charged-particle source being operated at a high vacuum,
    an emitter electrode, having an emitter surface configured to emit charged particles of a specific particle species along the direction of emission,
    a counter electrode configured to being applied an electrostatic voltage with respect to the emitter electrode at a sign opposite to that of the electrically charged particles, the counter electrode having an emitter aperture at a location downstream of the emitter surface along said direction of emission,
    a source space defined between the emitter surface and the emitter aperture,
    a suppressor electrode of Wehnelt type, said suppressor electrode being located between the emitter electrode and the counter electrodes, said suppressor electrode being configured to being applied a control voltage with regard to the emitter electrode, and having an aperture at a location downstream of the emitter electrode along said direction of emission,
    the charged particle source having a basic overall geometric rotational symmetry along a central axis and being operable in an emission mode, wherein charged particles are emitted from the emission surface and a voltage is applied between the emitter electrode and the counter electrode, causing an electric field and thus a force acting on the charged particles, to accelerate at least part of the charged particles towards the counter electrode and through the aperture along the direction of emission,
    the charged-particle source further comprising
        at least one adjustment electrode located surrounding the source space between the emitter electrode and the counter electrode, and each adjustment electrode being configured to being applied a controlled electrostatic voltage with respect to the emitter or counter electrode, and
    wherein at least one adjustment electrode is a steering electrode which is separate from said suppressor electrode and which has a geometry breaking the rotational symmetry of the source and interrupts the radial axial-symmetry of the electrostatic potential of the source, configured to force unintended, secondary charged particles away from the emission surface.

2. The charged particle source according to claim 1, said suppressor electrode is a ring electrode which includes a Wehnelt-electrode aperture coaxial with the emitter aperture of the counter electrode.

3. The charged particle source of claim 1, wherein the suppressor electrode has a geometry which deviates from the radial axial symmetry of the source, said suppressor electrode is selected from a group consisting of:
    a shifted suppressor, which is a suppressor electrode having an axis of symmetry which is positioned at a given, non-zero displacement with respect to the central axis and a tilted suppressor, which is a suppressor electrode having an axis of symmetry which is positioned inclined with a given, non-zero angle with respect to the central axis.

4. The charged particle source of claim 1, wherein said steering electrode, or in the case of a plurality of steering electrodes at least one of said steering electrodes, is a displacement electrode, namely, an electrode comprising an aperture, the aperture extending along an aperture axis, the aperture axis being located displaced from the central axis by a non-zero predetermined or adjustable distance.

5. The charged particle source of claim 1, wherein said steering electrode, or in the case of a plurality of steering electrodes at least one of said steering electrodes, is a sheared electrode, namely, an electrode comprising an aperture, the aperture extending along an aperture axis, the aperture axis being tilted from the central axis by a non-zero predetermined or adjustable angle.

6. The charged particle source of claim 1, wherein said steering electrode, or in the case of a plurality of steering electrodes at least one of said steering electrodes, is a ramped electrode, namely, an electrode comprising an aperture and having a varying thickness as measured along the direction of the central axis, said thickness varying between a minimal and a maximal value, which differ by a non-zero predetermined or adjustable maximal step size, at positions opposite to each other with respect to the central axis.

7. The charged particle source of claim 1, wherein said steering electrode, or in the case of a plurality of steering electrodes at least one of said steering electrodes, is a tilted electrode, namely, an electrode comprising an aperture and having a body axis which is tilted from the central axis by a non-zero predetermined or adjustable angle.

8. The charged particle source of claim 1, comprising a first steering electrode realized as a tilted electrode, said tilted electrode being an electrode comprising an aperture and having a body axis which is tilted from the central axis by a non-zero predetermined or adjustable angle, and a second steering electrode realized as a displacement electrode located downstream of the tilted electrode, as seen along the direction of emission, said displacement electrode being an electrode comprising an aperture extending along an aperture axis, the aperture axis being located displaced from the central axis by a non-zero predetermined or adjustable distance.

9. The charged particle source of claim 8, wherein said displacement electrode is located immediately after the tilted electrode along the direction of emission.

10. The charged particle source of claim 1, wherein said steering electrode, or in the case of a plurality of steering electrodes at least one of said steering electrodes, is an elliptical electrode, namely, an electrode having an aperture of elliptical shape, said elliptical shape defined by lengths of the two orthogonal main axes, with a predetermined ratio of said lengths of the two orthogonal main axes, $r13=p13a/p13b$ differing from 1.

11. The charged particle source of claim 1, wherein said steering electrode, or in the case of a plurality of steering electrodes at least one of the steering electrodes, is also a split electrode which is composed of at least two sectorial electrodes, said sectorial electrodes being separated by gaps consisting of vacuum or dielectric materials, wherein the sectorial electrodes of the split electrode are individually connected to a voltage supply system and configured to be applied mutually different electric potentials.

12. The charged particle source of claim 1, wherein at least one of the steering electrodes, is provided with piezo-electric actuators for adjusting the position of the electrode, said actuators being configured to shift and tilt the electrode with respect to the central axis.

13. The charged particle source of claim 1, wherein at least one of the steering electrodes, is mounted on a mounting device of ring-like shape having a central opening, said opening being sufficiently wide to allow mounting the electrode while not obstructing an aperture of the electrode through which the charged-particle beam propagate, wherein the electrode comprises at least three connectors configured for providing a connection to the mounting device.

14. The charged particle source of claim 13, wherein said three connectors are located at corners of a triangle, which is positionable on the ring-like shape, where the position of the electrode is adjustable on the ring-like shape with regard to its angular orientation along the ring-like shape.

15. The charged particle source of claim 1, where the emitter electrode is realized as an electrode having an axis which is oriented normal to the emitter surface, and wherein the emitter electrode is selected from a group consisting of:
a shifted emitter, which is an emitter electrode having an axis of symmetry which is positioned at a given, non-zero displacement with respect to the central axis; and
a tilted emitter, which is an emitter electrode having an axis of symmetry which is positioned inclined with a given, non-zero angle with respect to the central axis.

16. The charged particle source of claim 1, configured to be mounted into a charged particle beam apparatus, wherein in the mounted state said central axis of the source is destined to coincide with an overall axis of symmetry of said charged particle beam apparatus.

17. A charge-particle beam apparatus suitable for use in charged-particle based nano-patterning or inspection, said apparatus comprising a charged particle source according to claim 1.

18. The charged particle source according to claim 1, wherein said suppressor electrode is located between the emitter electrode and the counter electrodes closer to the emitter electrode.

19. The charged particle source according to claim 1, configured for emission of electrons.

20. A charge-particle beam apparatus suitable for use in electron-based nano-pattering or inspection, said apparatus comprising an electron source according to claim 19.

* * * * *